United States Patent
Chen et al.

(10) Patent No.: US 12,347,770 B2
(45) Date of Patent: Jul. 1, 2025

(54) ONE-TIME-PROGRAMMABLE DEVICE STRUCTURE

(71) Applicant: Taiwan Semiconductor Manufacturing Company, Ltd., Hsinchu (TW)

(72) Inventors: Yu-Hsiang Chen, Hsinchu (TW); Wen-Sheh Huang, Hsin Chu (TW); Po-Hsiang Huang, Taipei (TW); Hsiu-Wen Hsueh, Taichung (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 322 days.

(21) Appl. No.: 17/703,710

(22) Filed: Mar. 24, 2022

(65) Prior Publication Data
US 2023/0307356 A1 Sep. 28, 2023

(51) Int. Cl.
*H01L 23/525* (2006.01)
*H10B 20/25* (2023.01)

(52) U.S. Cl.
CPC ................ *H01L 23/5252* (2013.01)

(58) Field of Classification Search
None
See application file for complete search history.

(56) References Cited

U.S. PATENT DOCUMENTS

| | | | |
|---|---|---|---|
| 2002/0168801 A1 | 11/2002 | Johns | |
| 2003/0198109 A1 | 10/2003 | Sakoh | |
| 2004/0157392 A1* | 8/2004 | Hao | H10D 1/692 257/E21.011 |
| 2005/0161765 A1* | 7/2005 | Tsau | H01L 23/5329 257/532 |
| 2008/0012138 A1* | 1/2008 | Wang | H01L 23/5252 257/758 |
| 2019/0304894 A1* | 10/2019 | Dorgan | H10D 64/68 |
| 2022/0013403 A1 | 1/2022 | Tien | |
| 2022/0068766 A1 | 3/2022 | Hsu | |

FOREIGN PATENT DOCUMENTS

TW 202211441 A 3/2022

OTHER PUBLICATIONS

Yu-Hsiang Chen et al., Back-End-of-Line Devices, U.S. Appl. No. 17/327,341, filed May 21, 2021, Assignee: Taiwan Semiconductor Manufacturing Company, Ltd., 26 pages specification, 16 pages drawings.

* cited by examiner

*Primary Examiner* — Dale E Page
*Assistant Examiner* — Derek L Nielsen
(74) *Attorney, Agent, or Firm* — HAYNES AND BOONE, LLP

(57) ABSTRACT

An interconnect structure according to the present disclosure includes a first dielectric layer, a first conductive feature and a second conductive feature in the first dielectric layer, a first dielectric feature disposed directly on the first conductive feature; a first etch stop layer (ESL) disposed over the first dielectric layer and the second conductive feature, a first conductive layer disposed on and in contact with the first dielectric feature, a second ESL disposed over the first conductive layer, a second dielectric layer disposed directly on the first ESL and the second ESL, a first via extending through the second dielectric layer and the second ESL to contact with the first conductive feature, and a second via extending through the second dielectric layer and the first ESL to contact with the second conductive feature.

20 Claims, 28 Drawing Sheets

ONE-TIME-PROGRAMMABLE DEVICE STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

The ever-smaller dimensions introduce hurdles in formation of high voltage devices, such as one-time-programmable (OTP) memory devices and high-resistance resistors. The high voltage devices may alter the topography that requires planarization through a substantial depth or formation of via openings through different dielectric layers. Therefore, while existing OTP memory device structures are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
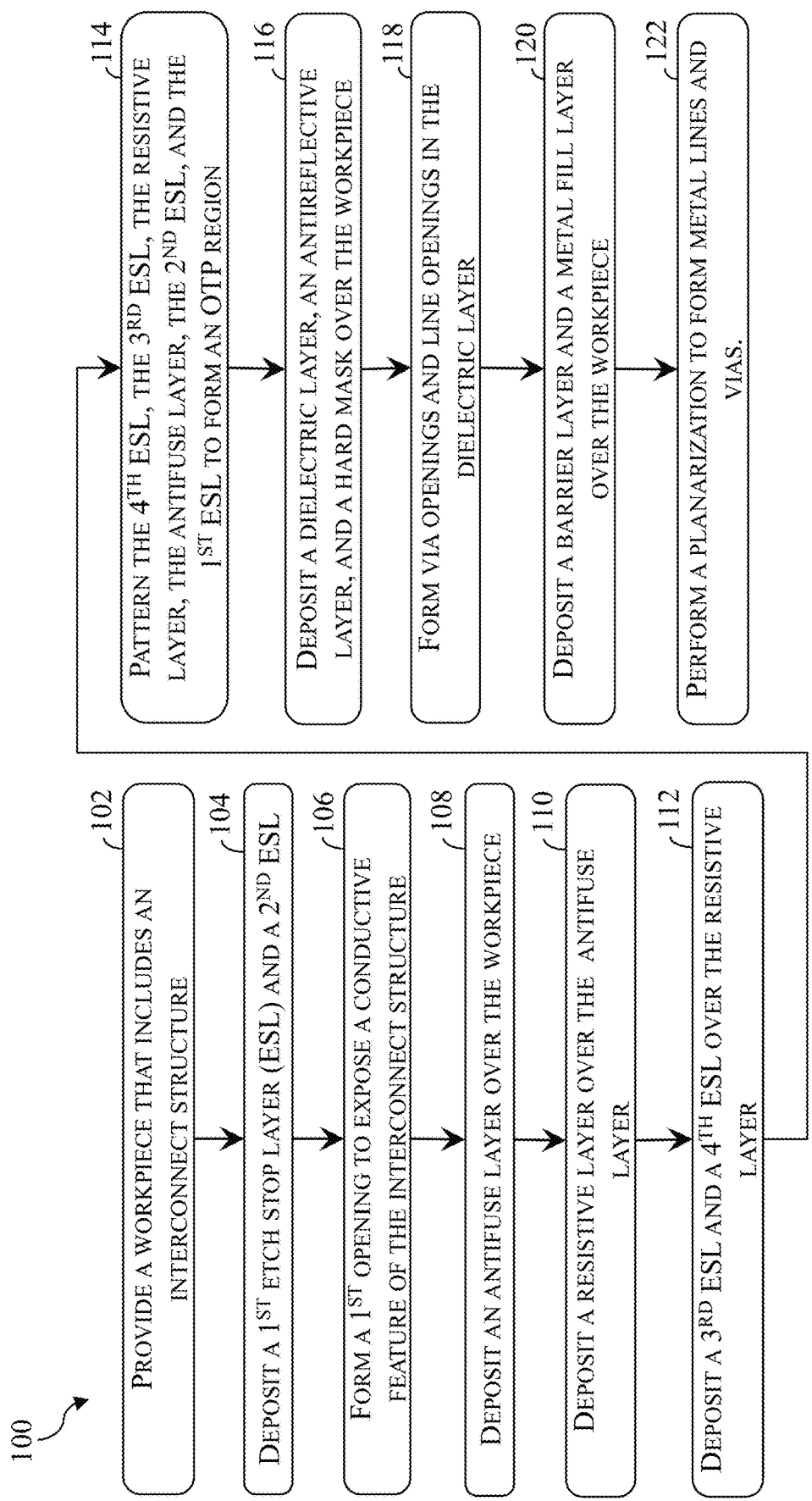
FIG. 1 is a flowchart illustrating a method of fabricating a device structure according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Semiconductor storage elements may be generally divided into two types-volatile memory devices and non-volatile memory devices. A volatile memory device loses stored information when the power is removed from the circuit. On the contrary, a non-volatile memory device retains stored information even after the power is removed. Non-volatile memory device may be further divided into two sub-categories. Multiple-time programmable (MTP) memory devices allow multiple programming operations. One-time programmable (OTP) memory devices allow only one non-reversible programming operation. OTP memory devices may be formed in back-end-of-line (BEOL) structures, such as an interconnect structure. Such a BEOL OTP memory may be disposed on a conductive feature, such a conductive line. Because the OTP memory device is disposed in one or more etch stop layers (ESLs), a contact via opening over a top electrode of the OTP memory device and a contact via over an adjacent conductive feature extend through different layers. Formation of via openings through different layers may lead to uneven loading and device defects. Additionally, planarization processes, such as chemical mechanical polishing (CMP) processes, tend to planarize metal features a lot faster than etch stop layers, which may lead to uneven surfaces and unreliable electrical contacts.

The present disclosure provides OTP memory device structures in an interconnect structure. In one example, an OTP memory device structure includes an antifuse layer and a conductive layer disposed over a first etch stop layer (ESL) and a second ESL. A third ESL and a fourth ESL are disposed over the conductive layer. A first contact via extends through the third ESL and the fourth ESL and a second contact via extends through the first ESL and the second ESL. Because both the first contact via and the second contact via extend through two ESLs, etch loading during simultaneous formation of the first contact via opening and the second contact via opening is minimized. In another example, the top electrode of an OTP memory device is planarized alongside an intermetal dielectric (IMD) layer, rather than etch stop layers. This arrangement ensures a more planar top surface.

The various aspects of the present disclosure will now be described in more detail with reference to the figures. In that regard, FIGS. 1 and 14 are flowcharts illustrating method 100 and method 300 of forming a device structure according to embodiments of the present disclosure. Methods 100 and 300 are merely examples and are not intended to limit the present disclosure to what is explicitly illustrated in method 100 or method 300. Additional steps may be provided before, during and after the method 100 or 300, and some steps described can be replaced, eliminated, or moved around for additional embodiments of the method. Not all steps are described herein in detail for reasons of simplicity. Method 100 is described below in conjunction with FIGS. 2-13, which are fragmentary cross-sectional views a workpiece 200 at different stages of fabrication according to embodiments of method 100. Method 300 is described below in conjunction with FIGS. 15-27, which are fragmentary cross-sectional views a workpiece 200 at different stages of fabrication according to embodiments of method 300. Because the workpiece 200 will be fabricated into a device structure at the conclusion of the fabrication processes, the workpiece 200 may also be referred to as a device structure 200 as the context requires. Additionally, throughout the present application, like reference numerals denote like features, unless otherwise excepted.

Figure 2:
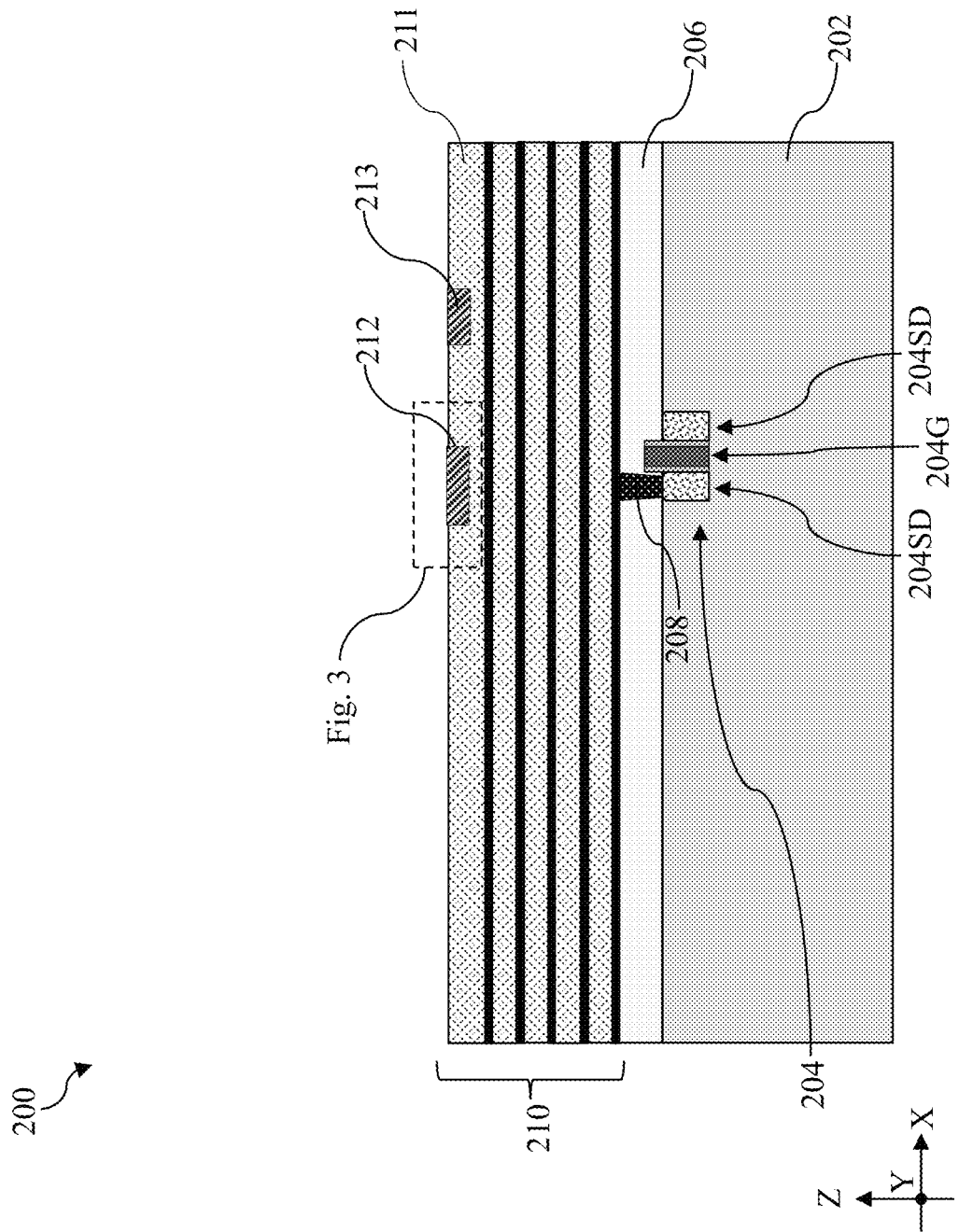
FIGS. 2-12 illustrate diagrammatic fragmentary cross-sectional views of a workpiece undergoing various stages of fabrication according to the method of FIG. 1, according to various aspects of the present disclosure.

Referring to FIGS. 1 and 2, method 100 includes a block 102 where a workpiece 200 is received. As shown in FIG. 2, the workpiece 200 may include a substrate 202 and an interconnect structure 210 disposed over the substrate 202. The substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure.

The workpiece 200 further includes a transistor 204 formed on the substrate 202. The transistor 204 may be a multi-gate device, such as a fin-like field effect transistor (FinFET) or a multi-bridge-channel (MBC) transistor. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may take form of nanowires, nanosheets, or other nanostructures and for that reasons, an MBC transistor may also be referred to as a nanowire transistor or a nanosheet transistor. As shown in FIG. 2, the transistor 204 includes source/drain features 204SD and a gate structure 204G disposed between the source/drain features 204SD. The gate structure 204G is disposed over an active region, which may have a fin-like shape or a plurality of channel members extending between the source/drain features 204SD. Detailed structures of the active region may not be explicitly shown in the figures.

The transistor 204 may be n-type or p-type. When the transistor 204 is n-type, the source/drain features 204SD may include silicon (Si) and an n-type dopant, such as phosphorus (P) or arsenic (As). When the transistor 204 is p-type, the source/drain feature 204SD may include silicon germanium (SiGe) and a p-type dopant, such as boron (B) or boron difluoride ($BF_2$). The gate structure 204G includes a gate dielectric layer and a gate electrode. In one embodiment, the gate dielectric layer may include hafnium oxide or other suitable high-k dielectric materials having a dielectric constant greater than that of silicon dioxide (~3.9). The gate electrode may include a single layer or alternatively a multi-layer structure, such as various combinations of a metal fill layer and a plurality of work function metal layers. By way of example, the gate electrode may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. The transistor 204 may be configured to serve as a logic device or a selection transistor for an OTP memory device. When the transistor 204 serves as a selection transistor for an OTP memory device, the gate structure 204G is coupled to a word line (WL) and one of the source/drain features 204SD is coupled to a source line (SL).

The workpiece 200 includes middle-end-of-line (MEOL) features to electrically connect the transistor to the interconnect structure 210. In the depicted embodiments, the transistor 204 in the workpiece 200 includes a source contact 208 over one of the source/drain features 204SD. The source contact 208 may include a metal fill layer formed of ruthenium (Ru), tungsten (W), cobalt (Co), nickel (Ni), copper (Cu), molybdenum (Mo). In some embodiments, the source contact 208 may further include a barrier layer to prevent undesirable oxygen diffusion or electro-migration. When formed, the barrier layer may include titanium nitride or tantalum nitride. The source contact 208 is disposed in an interlayer dielectric (ILD) layer 206. The ILD layer 206 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

The interconnect structure 210 is formed in the BEOL processes and is considered a BEOL structure. The interconnect structure 210 may include multiple interconnect layers. Each of the interconnect layers includes conductive lines and contact vias disposed in an intermetal dielectric (IMD) layer. The conductive lines and the contact vias may include aluminum (Al), tungsten (W), nickel (Ni), ruthenium (Ru), cobalt (Co), copper (Cu), or a combination thereof. The IMD layers may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silica glass (BSG), and/or other suitable dielectric materials. The ILD layer 206 and the IMD layers are low-dielectric-constant (low-k) dielectric materials having dielectric constant smaller than that of silicon dioxide (~3.9). The low dielectric constants of the ILD layer 206 and the IMD layers help lower parasitic capacitance among adjacent conductive features.

Conductive features in different interconnect layers may have different dimensions. In some instances, the first four (4) or five (5) metal layers closer to the substrate 202 may have smaller dimensions while the metal layers further above may have much larger dimensions. The interconnect structure 210 shown in FIG. 2 is incomplete and only includes lower metal layers, such as the first five (5) or the first six (6) metal layers. In other words, the topmost metal layer in the interconnect structure 210 may be a metal layer substantially thicker than the immediately underlying metal layer and the conductive features in the topmost metal layer are substantially larger than those in immediately underlying metal layer. The larger dimensions make it more economical to form OTP devices or high-resistance (Hi-R) resistors as performing photolithography and etching processes to such metal layers requires less accuracy and has higher tolerance. As shown in FIG. 2, the interconnect structure 210 includes an IMD layer 211. The interconnect structure 210 further includes a first conductive feature 212 and a second conductive feature 213 in the IMD layer 211. In some implementations, the first conductive feature 212 may be a first conductive line 212 and the second conductive feature 213 may be a second conductive line 213. It is noted that, for ease of illustrations, other conductive features, such as vias and conductive lines, in the interconnect structure 210 are omitted.

Figure 3:
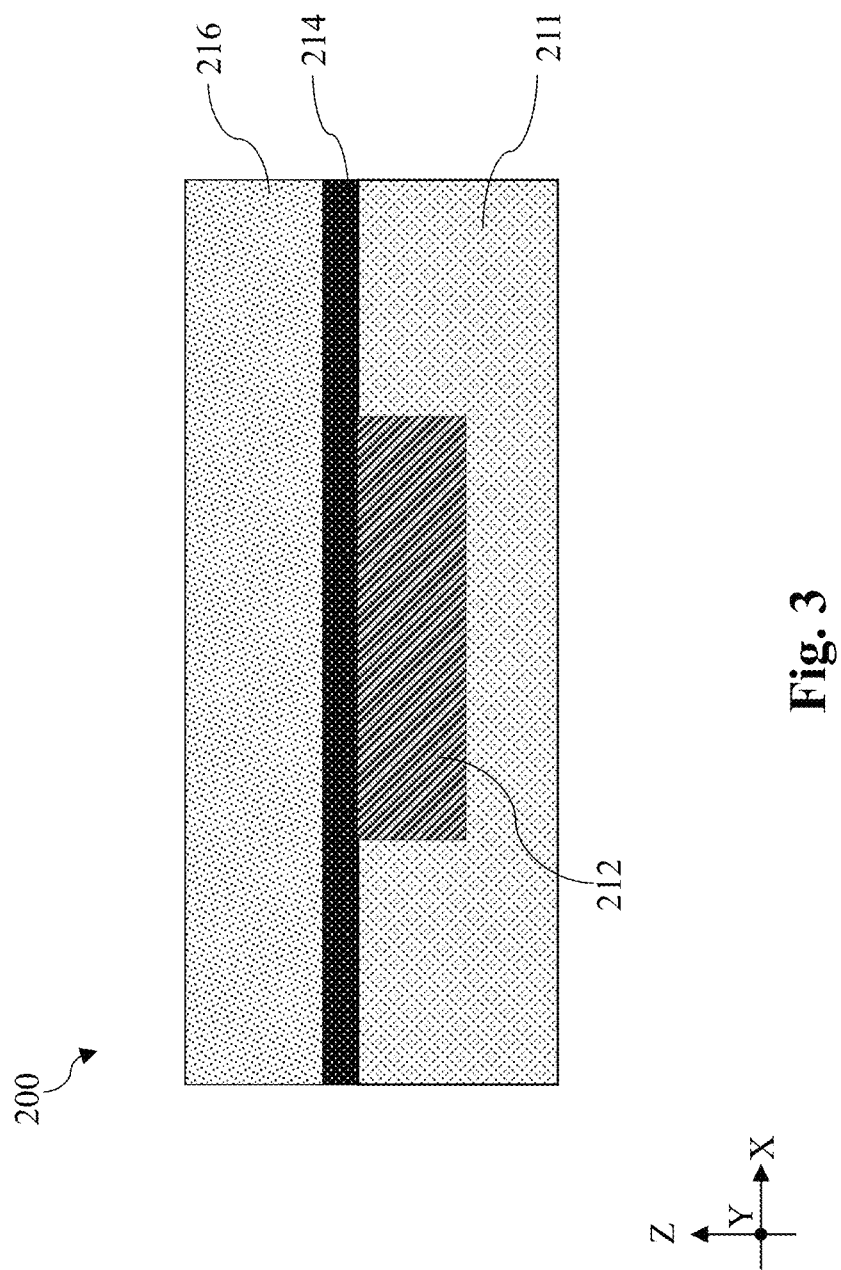

Referring to FIGS. 1, 2 and 3, method 100 includes a block 104 where a first etch stop layer (ESL) 214 and a second ESL 216 are deposited over the workpiece 200. A composition of the first ESL 214 is different from a composition of the second ESL 216. In some embodiments, the first ESL 214 may include aluminum oxide, aluminum nitride, or hydrogen-containing silicon carbonitride and the second ESL 216 may be nitrogen-free dielectric material, such as silicon oxide or hydrogen-containing silicon oxycarbide. The dotted rectangular area in FIG. 2 is enlarged and illustrated in FIG. 3, which is also a fragmentary cross-sectional view of the workpiece 200. At block 104, the first ESL 214 and the second ESL 216 may be deposited using chemical vapor deposition (CVD), plasma enhance CVD (PECVD), or atomic layer deposition (ALD). It is noted that depending on the processes, different interconnect layers may have different number of etch stop layers. While two etch stop layers are shown in FIG. 3, the present disclosure is not so limited and the workpiece 200 may include 3 or even 4 etch stop layers. Details of embodiments having more etch stop layers are omitted.

Figure 4:
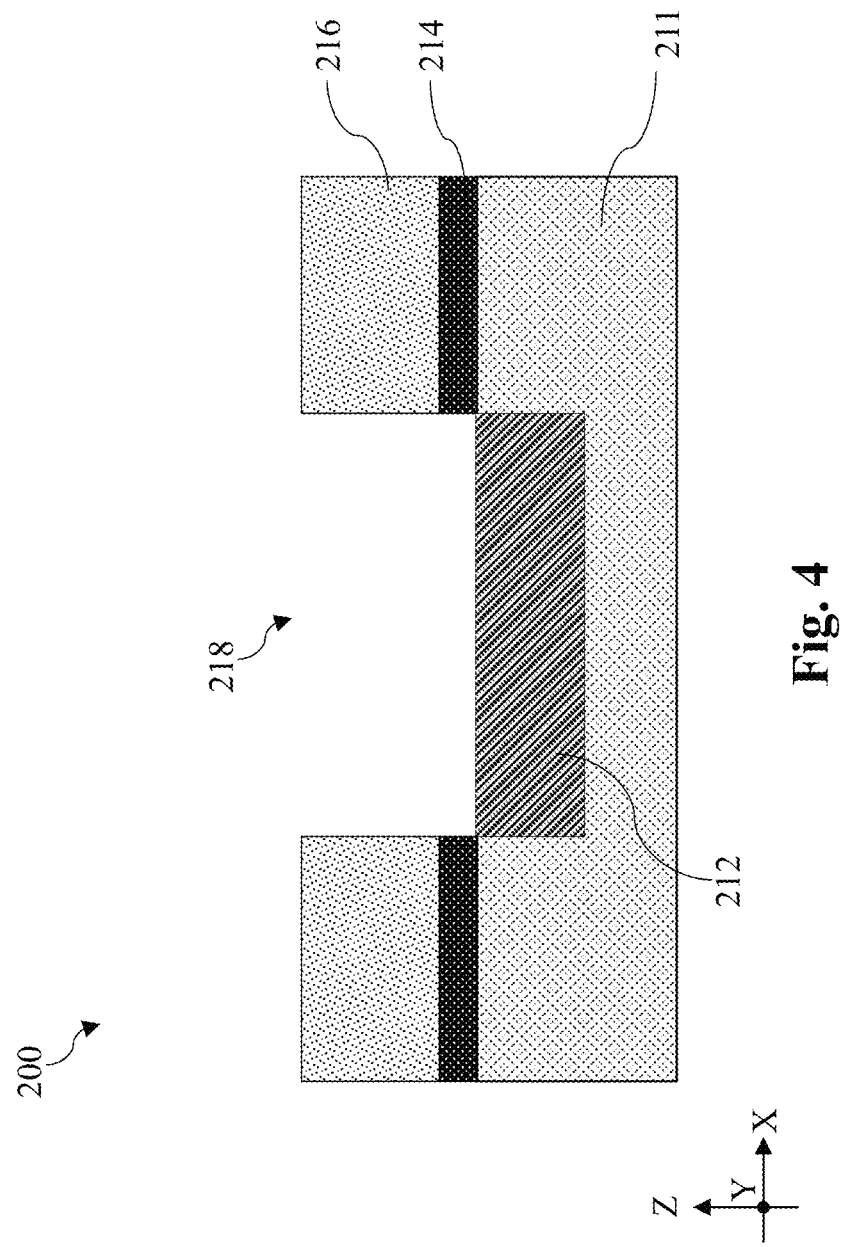
Figure 5:
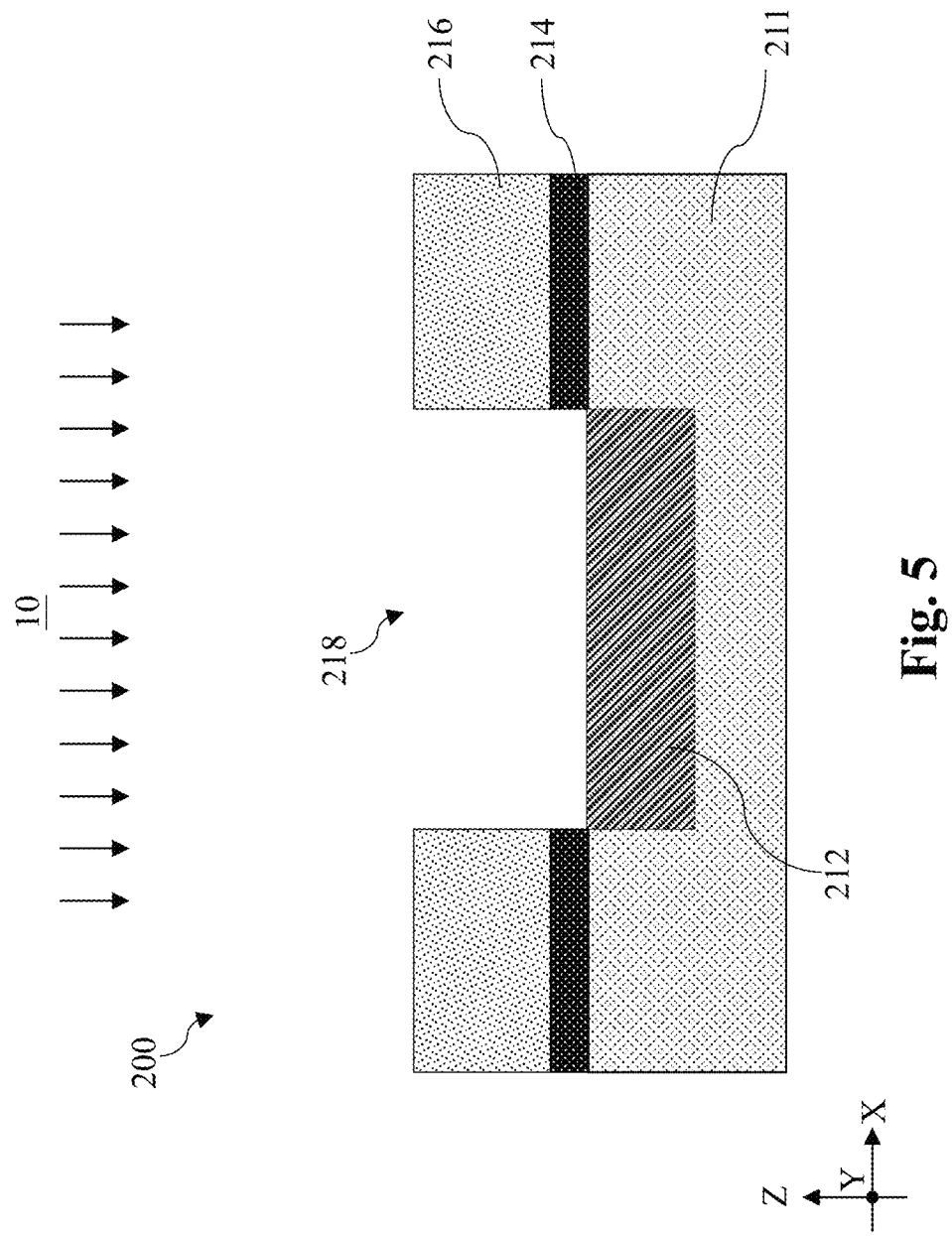

Referring to FIGS. 1 and 4, method 100 includes a block 106 where a first opening 218 is formed in the workpiece 200 to expose the first conductive line 212. In an example process, a bottom antireflective coating (BARC) layer is deposited over the second ESL 216. A photoresist layer is then deposited over the BARC layer using spin-on coating. After the deposition of the photoresist layer, photolithography processes are performed to pattern the photoresist layer. The patterned photoresist layer is then used as an etch mask in etching the BARC layer to form a patterned BARC layer. The patterned BARC layer is then applied as an etch mask to etch the workpiece 200, including the second ESL 216 and the first ESL 214, to form the first opening 218. At block 106, the first ESL 214 and the second ESL 216 may be anisotropically etched using a reactive-ion-etching (RIE) process that uses oxygen, hydrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. After the first ESL 214 is breached by the anisotropic etching process, a wet clean process may be performed to remove undesirable debris. The wet clean process may include use of deionized (DI) water, a standard clean 1 (SC1) solution, a standard clean 2 (SC2) solution, or a combination thereof. After the wet clean process, a top surface of the first conductive feature 212 is exposed in the first opening 218. As shown in FIG. 4, the first opening 218 extends through the first ESL 214 and the second ESL 216. To remove solvents used in the wet clean process, the workpiece 200 may be subject to a bake process 10 as shown in FIG. 5. In some implementations, the bake process 10 includes a temperature between about 250° C. and about 350° C.

Figure 6:
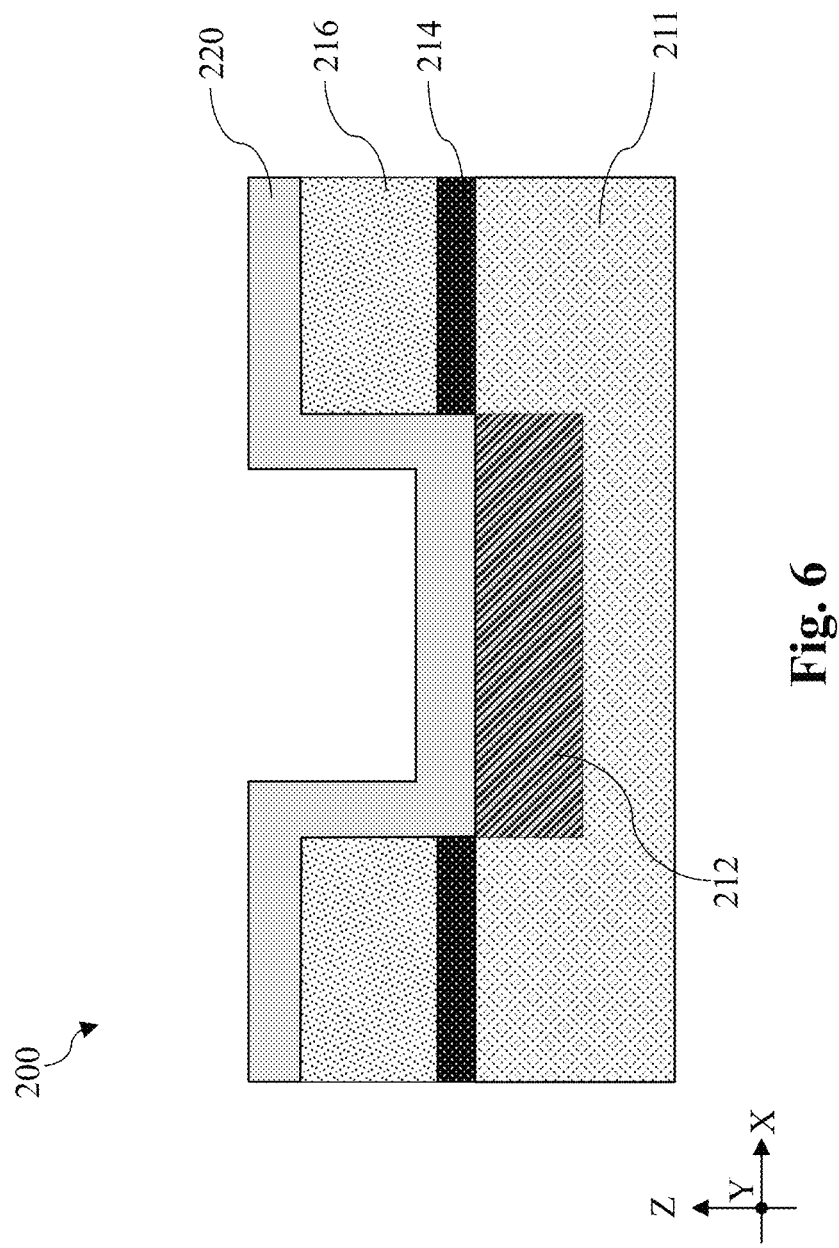

Referring to FIGS. 1, 5 and 6, method 100 includes a block 108 where an antifuse layer 220 is deposited over the workpiece 200. After the bake process 10, the antifuse layer 220 may be conformally deposited over the workpiece 200 using atomic layer deposition (ALD), CVD, or plasma-enhanced CVD (PECVD). The antifuse layer 220 may include a high-dielectric-constant (high-k) dielectric layer that has a dielectric constant greater than that of silicon dioxide (about 3.9). In some embodiments, the breakdown layer 220 may include hafnium oxide (HfO), aluminum oxide (AlO), aluminum nitride (AlN), titanium oxide (TiO), hafnium zirconium oxide (HfZrO), tantalum oxide (TaO), hafnium aluminum oxide (HfAlO), hafnium silicon oxide (HfSiO), zirconium oxide (ZrO), zirconium silicon oxide (ZrSiO), lanthanum oxide (LaO), yttrium oxide (YO), strontium titanium oxide (SrTiO), barium titanium oxide (BaTiO), barium zirconium oxide (BaZrO), hafnium lanthanum oxide (HfLaO), lanthanum silicon oxide (LaSiO), aluminum silicon oxide (AlSiO), hafnium tantalum oxide (HfTaO), hafnium titanium oxide (HfTiO). In one embodiment, the antifuse layer 220 may be formed of aluminum oxide (AlO). Depending on the design, the antifuse layer 220 may have a thickness between about 10 Å and about 100 Å. Given the same quality of the antifuse layer 220 and a fixed area of the antifuse layer 220, the thickness of the antifuse layer 220 substantially determines the breakdown voltage of the OTP memory device it forms. For example, when the breakdown layer 220 has a thickness about 20 Å, the breakdown voltage of the antifuse layer 220 (or the OTP memory device it forms) is between about 1.5 V and about 2 V. When the antifuse layer 220 is thinner than 10 Å, the antifuse layer 220 may experience premature breakdown at a lower-than-design voltage. When the antifuse layer 220 is thicker than 100 Å, the breakdown voltage of the antifuse layer 220 may be higher than the highest operating voltage of the device structure 200. Because the antifuse layer 220 is configured to break down to form an electrical connection, the antifuse layer 220 may also be referred to as a breakdown layer 220.

Figure 7:
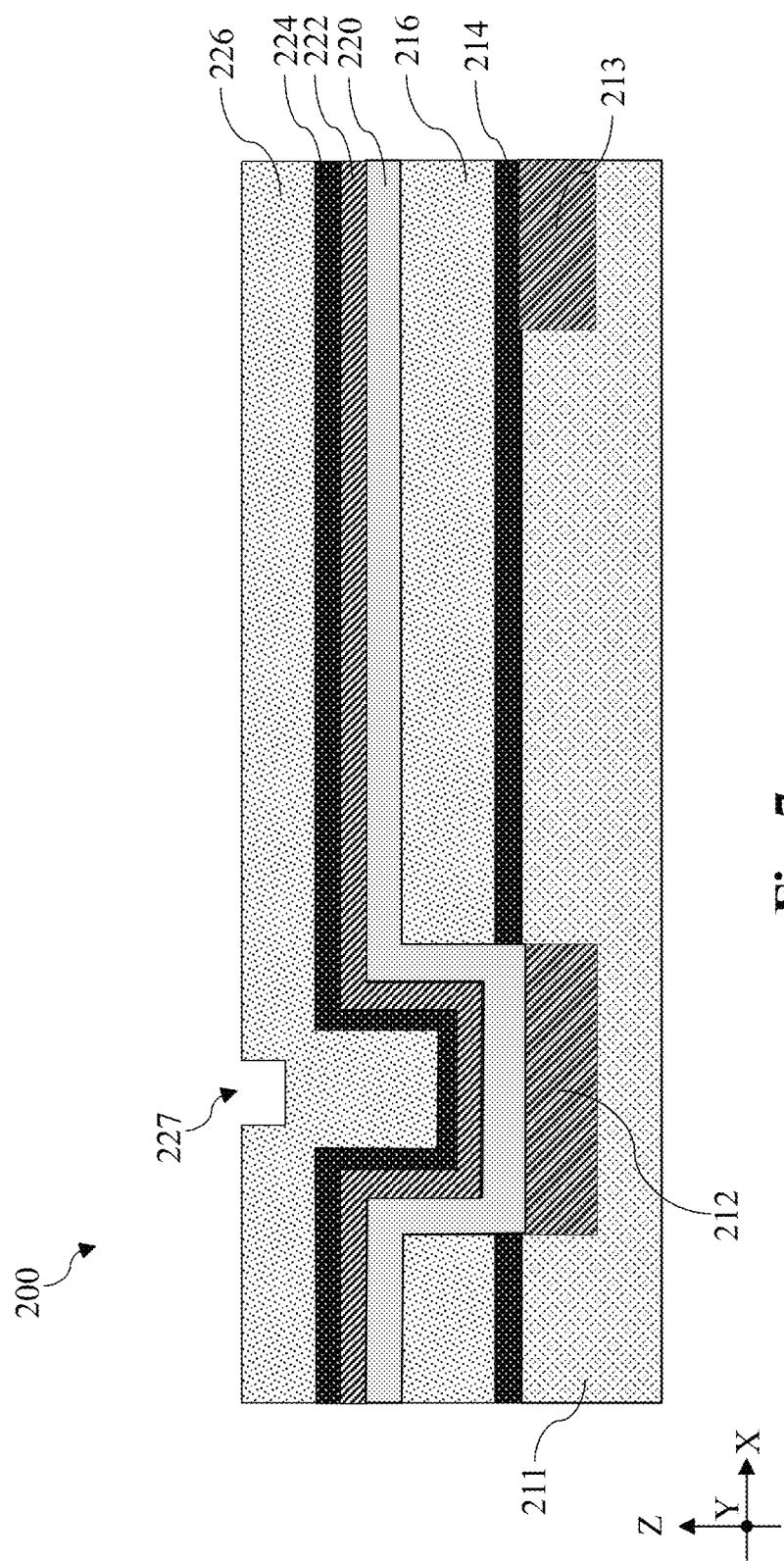

Referring to FIGS. 1 and 7, method 100 includes a block 110 where a resistive layer 222 is deposited over the antifuse layer 220. The resistive layer 222 may be a metal layer or a conductive metal nitride layer. In some embodiments, the resistive layer 222 may include titanium nitride (TiN), tantalum nitride (TaN), tungsten nitride (WN), or a combination thereof. The resistive layer 222 may be conformally deposited over antifuse layer 220 and the first opening 218 by ALD, PVD, CVD, e-beam evaporation, or other suitable process. In some embodiments represented in FIG. 7, the resistive layer 222 may function as a resistive element of a high-resistance (Hi-R) resistor. In those embodiments, the resistive layer 222 may be formed of relatively less conductive material such as tantalum nitride (TaN) and a composition of the resistive layer 222 is different from a composition of the first conductive feature 212. As will be described further below, a Hi-R resistor is also formed over the workpiece 200 and the resistive layer 222 is formed of tantalum nitride (TaN).

Referring to FIGS. 1 and 7, method 100 includes a block 112 where a third ESL 224 and a fourth ESL 226 over the resistive layer 222. A composition of the third ESL 224 is different from a composition of the fourth ESL 226. In some embodiments, the third ESL 224 may include aluminum oxide, aluminum nitride, or hydrogen-containing silicon carbonitride and the fourth ESL 226 may be nitrogen-free dielectric material, such as silicon oxide or hydrogen-containing silicon oxycarbide. The third ESL 224 and the fourth ESL 226 may be deposited using ALD or CVD. In some instances, a composition of the third ESL 224 may be similar to a composition of the first ESL 214 and a composition of the fourth ESL 226 may be similar to a composition of the second ESL 216. In some embodiments, due to the presence of the first opening 218 (shown in FIG. 5), the fourth ESL 226 may include a recess 227 directly over the first opening 218. Because subsequent operations of method 100 affect structures farther away from the first conductive feature 212, FIG. 7 shows a larger cross-sectional view than FIG. 6.

Figure 8:
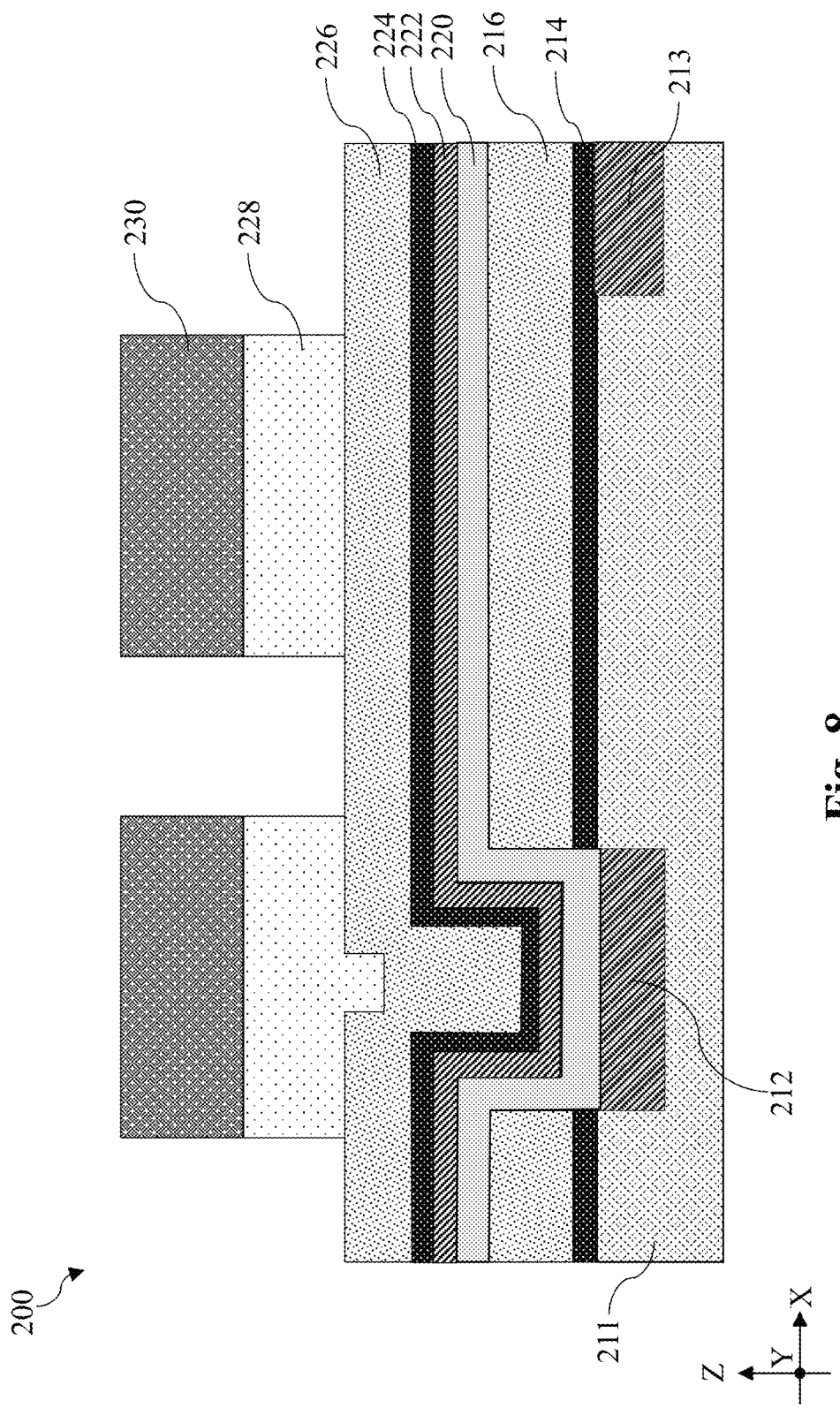
Figure 9:
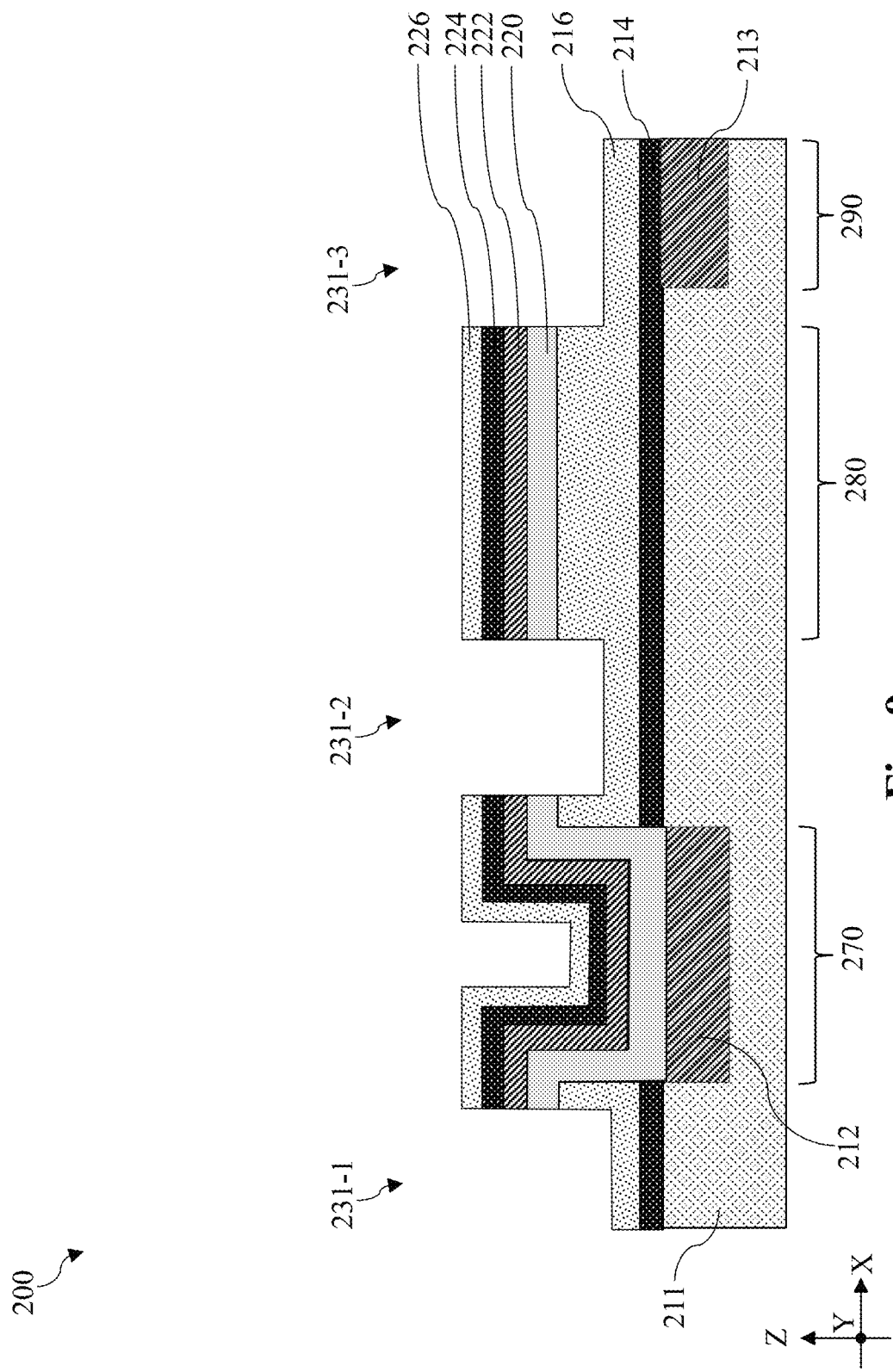

Referring to FIGS. 1, 8 and 9, method 100 includes a block 114 where the fourth ESL 226, the third ESL 224, the resistive layer 222, the antifuse layer 220, and the second ESL 216 are patterned to form an OTP region 290, a Hi-R region 292, and a logic region 294. Operations at block 114 include deposition of a bottom antireflective coating (BARC) layer 228 over the workpiece 200 (shown in FIG. 8), deposition of a photoresist layer 230 over the BARC layer 228 (shown in FIG. 8), patterning of the BARC layer 228 (shown in FIG. 8), and etching of the fourth ESL 226, the third ESL 224, the resistive layer 222, the antifuse layer 220, and the second ESL 216 (shown in FIG. 9). Referring first to FIG. 8, the BARC layer 228 is deposited over the fourth ESL 226 using spin-on coating or flowable CVD (FCVD). Then the photoresist layer 230 is deposited over the BARC layer 228 using spin-on coating. After the deposition of the photoresist layer 230, photolithography processes are performed to pattern the photoresist layer 230. The patterned photoresist layer 230 is then used as an etch mask in etching the BARC layer 228 to form a patterned BARC layer 228. Referring to FIG. 9, the patterned BARC layer 228 is then applied as an etch mask to etch the workpiece 200, including the fourth ESL 226, the third ESL 224, the resistive layer 222, the antifuse layer 220, and the second ESL 216. The etch process at block 114 may include an anisotropic etch process, such as a reactive-ion-etching (RIE) process that uses oxygen, hydrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. After the patterning, the residual photoresist layer 230 and the BARC layer 228 may be removed by stripping, ashing, or selective etching.

Reference is made to FIG. 9. Operations at block 114 form a first recess 231-1, a second recess 231-2, and a third recess 231-3. The first recess 231-1, the second recess 231-2 and the third recess 231-3 extend partially into the second ESL 216 to define the OTP region 290, the Hi-R region 292 and the logic region 294. The OTP region 290 is defined between the first recess 231-1 and the second recess 231-2 along the X direction. The Hi-R region 292 is defined between the second recess 231-2 and the third recess 231-3 along the X direction. At least a portion of the third recess 231-3 is directly over the second conductive feature 213. The vertical intersection of the third recess 231-3 and the second conductive feature 213 defines the logic region 294. Along the vertical direction, the OTP region 290 include the first conductive feature 212, the antifuse layer 220 on the first conductive feature 212, the resistive layer 222 on the antifuse layer 220, the third ESL 224 on the resistive layer 222, and the fourth ESL 226 on the third ESL 224. It is noted that the fourth ESL 226 over the OTP region 290 is thinned during the patterning process. In the OTP region 290, the first conductive feature 212 functions as a bottom electrode, the antifuse layer 220 functions as an antifuse, and the resistive layer 222 functions as a top electrode. It is noted that, due to the formation of the first opening 218 (shown in FIG. 5), the resistive layer 222 in the OTP region 290 includes a lower horizontal portion extending along a top surface of the first conductive feature 212 and an upper horizontal portion extending along a top surface of the second ESL 216.

Along the vertical direction, the Hi-R region 292 includes the first ESL 214, the second ESL 216, the antifuse layer 220, the resistive layer 222 over the antifuse layer 220, the third ESL 224 over the resistive layer 222, and the fourth ESL 226 over the third ESL 224. Along the X direction, the resistive layer 222 in the Hi-R region 292 may serve as a resistive element. Along the vertical direction, the logic region 294 includes the first ESL 214 and the second ESL 216. The logic region 294 is free of the antifuse layer 220 and the resistive layer 222 such that a contact via over the second conductive feature 213 does not penetrate through any of the antifuse layer 220 and the resistive layer 222.

Figure 10:
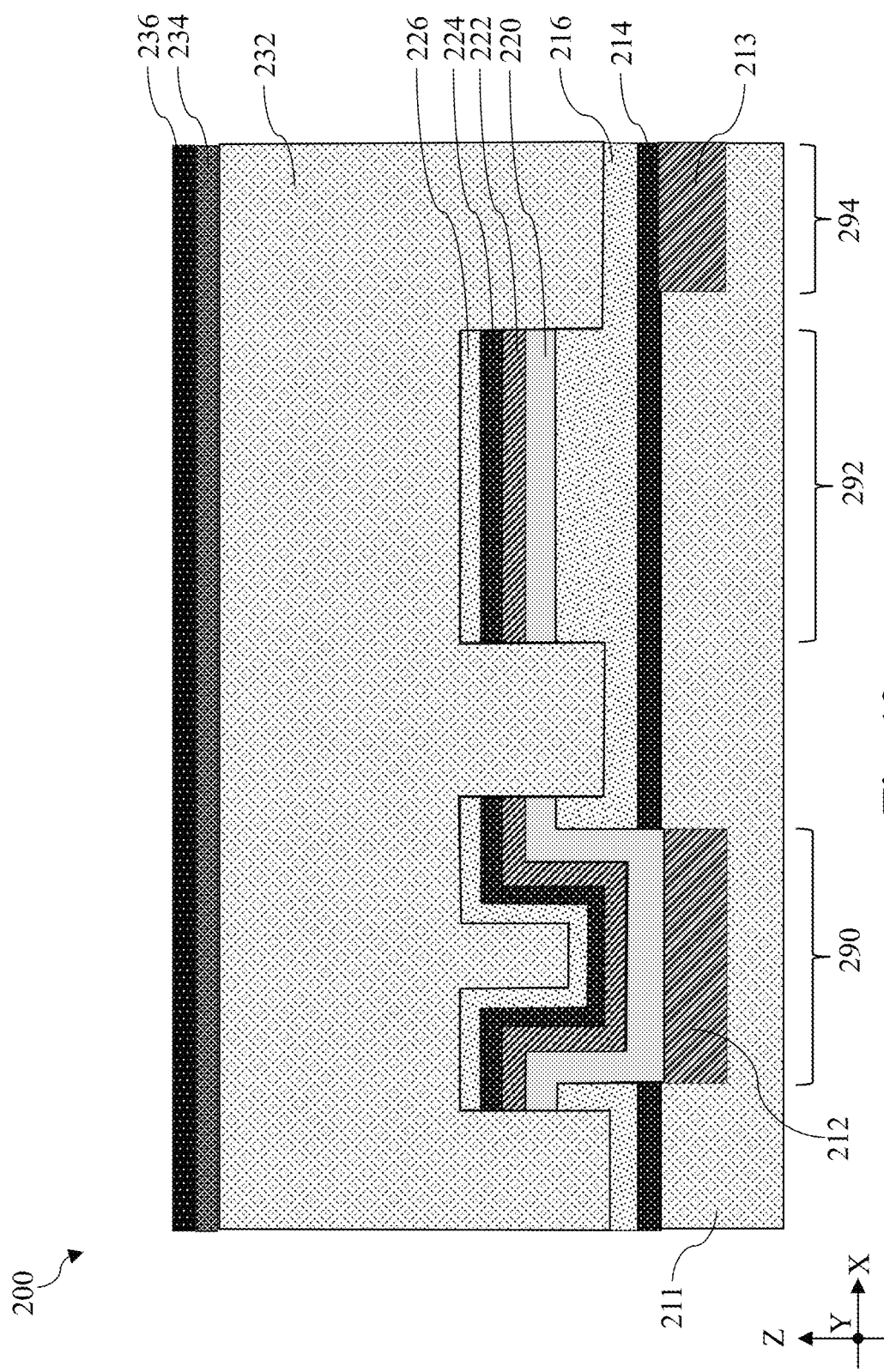

Referring to FIGS. 1 and 10, method 100 includes a block 116 where an IMD layer 232, an antireflective layer 234, and a hard mask layer 236 are deposited over the workpiece 200. Like the other IMD layers in the interconnect structure 210, the IMD layer 232 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silica glass (BSG), and/or other suitable dielectric materials. The IMD layer 232 may be deposited using spin-on coating or FCVD. Then the antireflective layer 234 is deposited over the IMD layer 232 using CVD, PECVD, or a suitable method. In some embodiments, the antireflective layer 234 may be free of nitrogen and may include silicon, carbon, oxygen, or hydrogen. In these embodiments, the nitrogen-free antireflective (NFARC) layer 234 has different etch selectivity than the hard mask layer 236. This arrangement facilitates etch end point detection and control. In some embodiments, the hard mask layer 236 includes titanium nitride (TiN), silicon carbide (SiC), or tungsten (W). In one embodiment, the hard mask layer 236 includes titanium nitride. The hard mask layer 236 may be deposited using metal organic CVD (MOCVD), CVD, physical vapor deposition (PVD), or a suitable deposition method.

Figure 11:
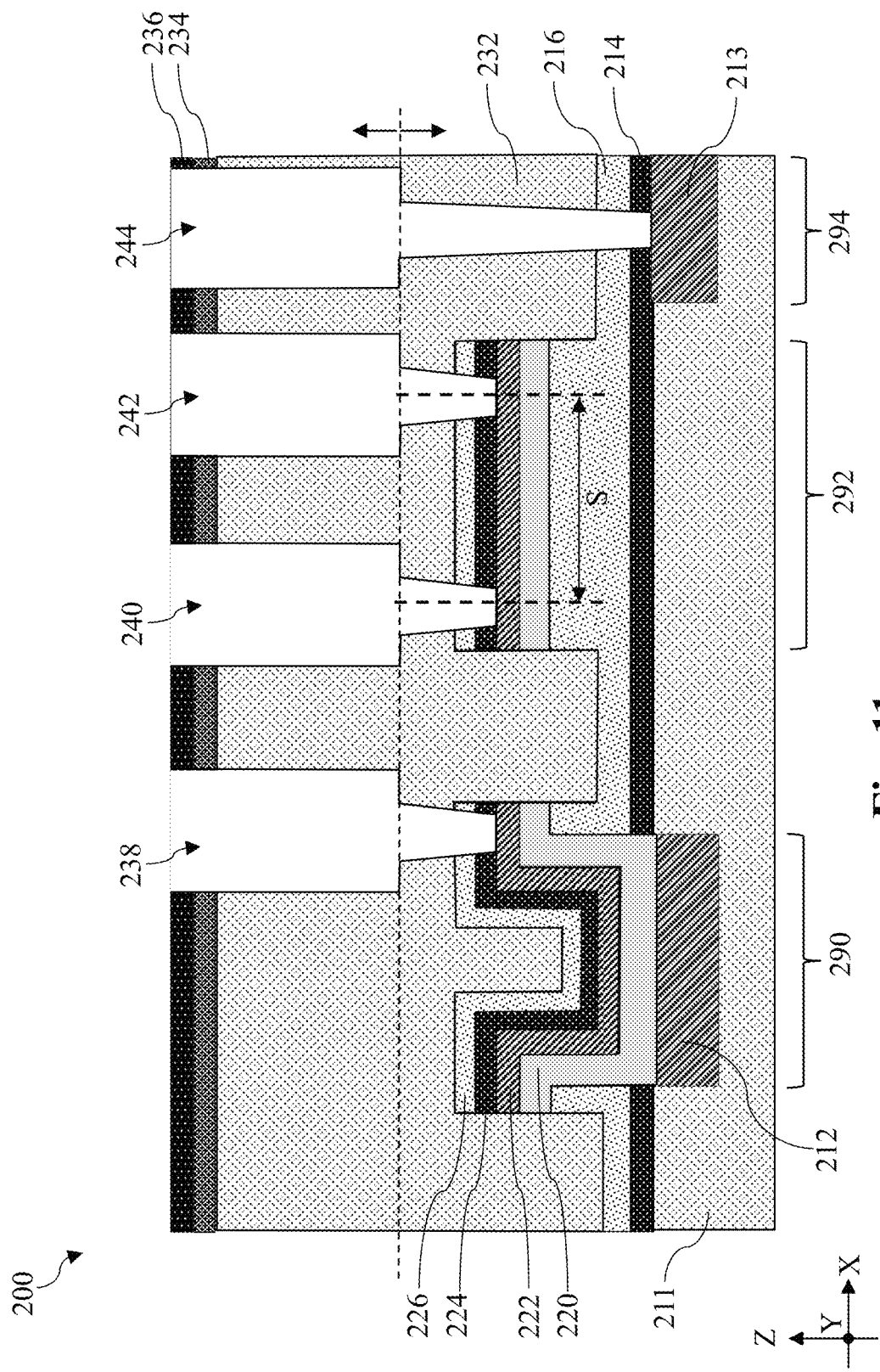

Referring to FIGS. 1 and 11, method 100 includes a block 118 where via openings and line openings are formed in the IMD layer 232. Using a combination of photolithography processes and etch processes, a first contact opening 238, a second contact opening 240, a third contact opening 242, and a fourth contact opening 244 are formed in the IMD layer 232. As illustrated by the dotted line, each of the contact openings includes a lower via opening portion and an upper line opening portion. The line opening portions extend lengthwise along the Y direction while the via openings provide vertical connections. The contact openings shown in FIG. 11 may be formed using a two-step etch process. The first contact opening 238 is disposed directly over the OTP region 290 and the lower via portion of the first contact opening 238 extends through the IMD layer 232, the fourth ESL 226 and the third ESL 224 to expose the upper horizontal portion of the resistive layer 222. The upper line portion of the first contact opening 238 extends through the hard mask layer 236, the antireflective layer 234, and a portion of the IMD layer 232. The second contact opening 240 and the third contact opening 242 are disposed directly over the Hi-R region 292. The lower via portions of the second contact opening 240 and the third contact opening 242 extend through the IMD layer 232, the fourth ESL 226 and the third ESL 224 to expose the resistive layer 222 over the Hi-R region 292. The upper line portions of the second contact opening 240 and the third contact opening 242 extend through the hard mask layer 236, the antireflective layer 234, and a portion of the IMD layer 232. The lower via portions of the second contact opening 240 and the third contact opening 242 are spaced apart by a spacing S, which at least in part determines the resistance of the Hi-R device in the Hi-R region 292. The fourth contact opening 244 is disposed directly over the logic region 294. As the logic region 294 is free of the antifuse layer 220 and the resistive layer 222, the lower portion of the fourth contact opening 244 extends through the IMD layer 232, the second ESL 216 and the first ESL 214 to expose the second conductive feature 213. The upper line portion of the fourth contact opening 244 extend through the hard mask layer 236, the antireflective layer 234, and a portion of the IMD layer 232. It is noted that the first contact opening 238, the second contact opening 240, the third contact opening 242, and the fourth contact opening 244 may be formed simultaneously using the same processes without substantial etch loading as all of them goes through two etch stop layers. The first contact opening 238, the second contact opening 240 and the third contact opening 242 extend through the fourth ESL 226 and the third ESL 224. The fourth contact opening 244 extends through the second ESL 216 and the first ESL 214.

Figure 12:
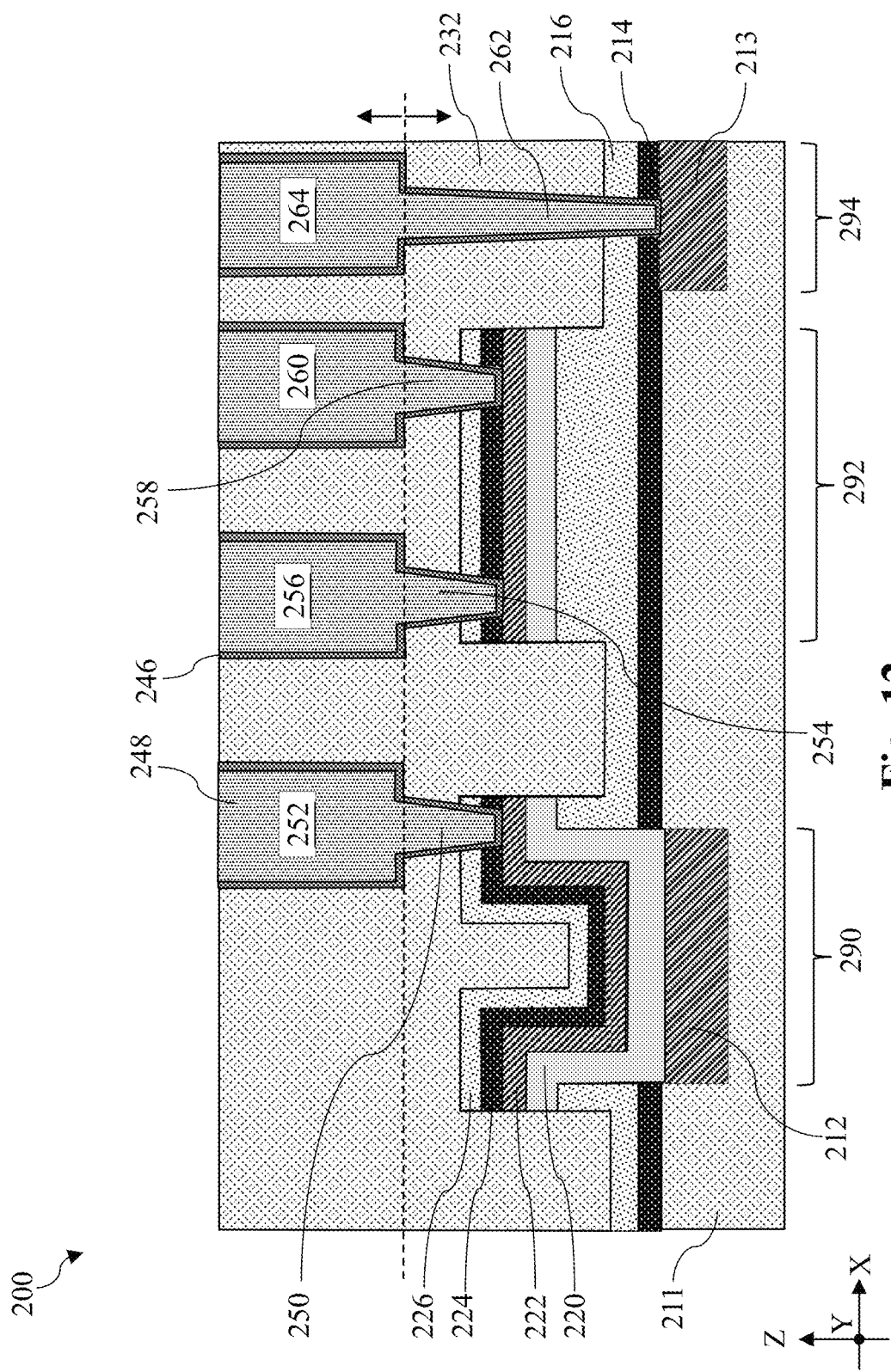

Referring to FIGS. 1 and 12, method 100 includes a block 120 where a barrier layer 246 and a metal fill layer 248 are deposited over the workpiece 200. The barrier layer 246 may include manganese nitride (MnN), titanium nitride (TiN) or tantalum nitride (TaN) and may be deposited using ALD, CVD, or a suitable method. Then the metal fill layer 248 is deposited over the barrier layer 246. The metal fill layer 248 may include copper (Cu) and may be deposited using physical vapor deposition (PVD), electroless plating, electroplating, or a suitable method. In some embodiments, when the metal fill layer 248 is deposited using electroplating, a seed layer may be deposited over the barrier layer before the metal fill layer 248 is deposited. The seed layer may include copper and may be deposited using PVD. Although not explicitly shown in the figures, in some embodiments, a liner may be deposited on the barrier layer 246 before subsequent layers are deposited. In those embodiments, the liner may include cobalt (Co), nickel (Ni), or ruthenium (Ru). The liner may be deposited using PVD. As shown in FIG. 12, the barrier layer 246 in the first contact opening 238, the second contact opening 240, the third contact opening 242, and the fourth contact opening 244 is in direct contact with the IMD layer 232, the fourth ESL 226, the third ESL 224, the resistive layer 222, the second ESL 216 (in case of the fourth contact opening 244), and the first ESL 214 (in case of the fourth contact opening 244). The barrier layer 246 spaces the metal fill layer 248 from the IMD layer 232, the fourth ESL 226, the third ESL 224, the resistive layer 222, the second ESL 216 (in case of the fourth contact opening 244), and the first ESL 214 (in case of the fourth contact opening 244).

Referring to FIGS. 1 and 12, method 100 includes a block 122 where the workpiece 200 is planarized to form metal lines and vias. After the deposition of the barrier layer 246 and the metal fill layer 248, the workpiece 200 is planarized using, for example, chemical mechanical polishing (CMP) to remove the excess barrier layer 246, the excess metal fill layer 248, the hard mask layer 236, the antireflective layer 234, and a portion of the IMD layer 232. As shown in FIG. 12, after the planarization of the workpiece 200, a first via 250, a first metal line 252, a second via 254, a second metal line 256, a third via 258, a third metal line 260, a fourth via 262, and a fourth metal line 264 are formed. Top surfaces of the first metal line 252, the second metal line 256, the third metal line 260, and the fourth metal line 264 are coplanar with a top surface of the IMD layer 232. Each of the first metal line 252, the second metal line 256, the third metal line 260, and the fourth metal line 264 extend lengthwise along the Y direction.

Figure 13:
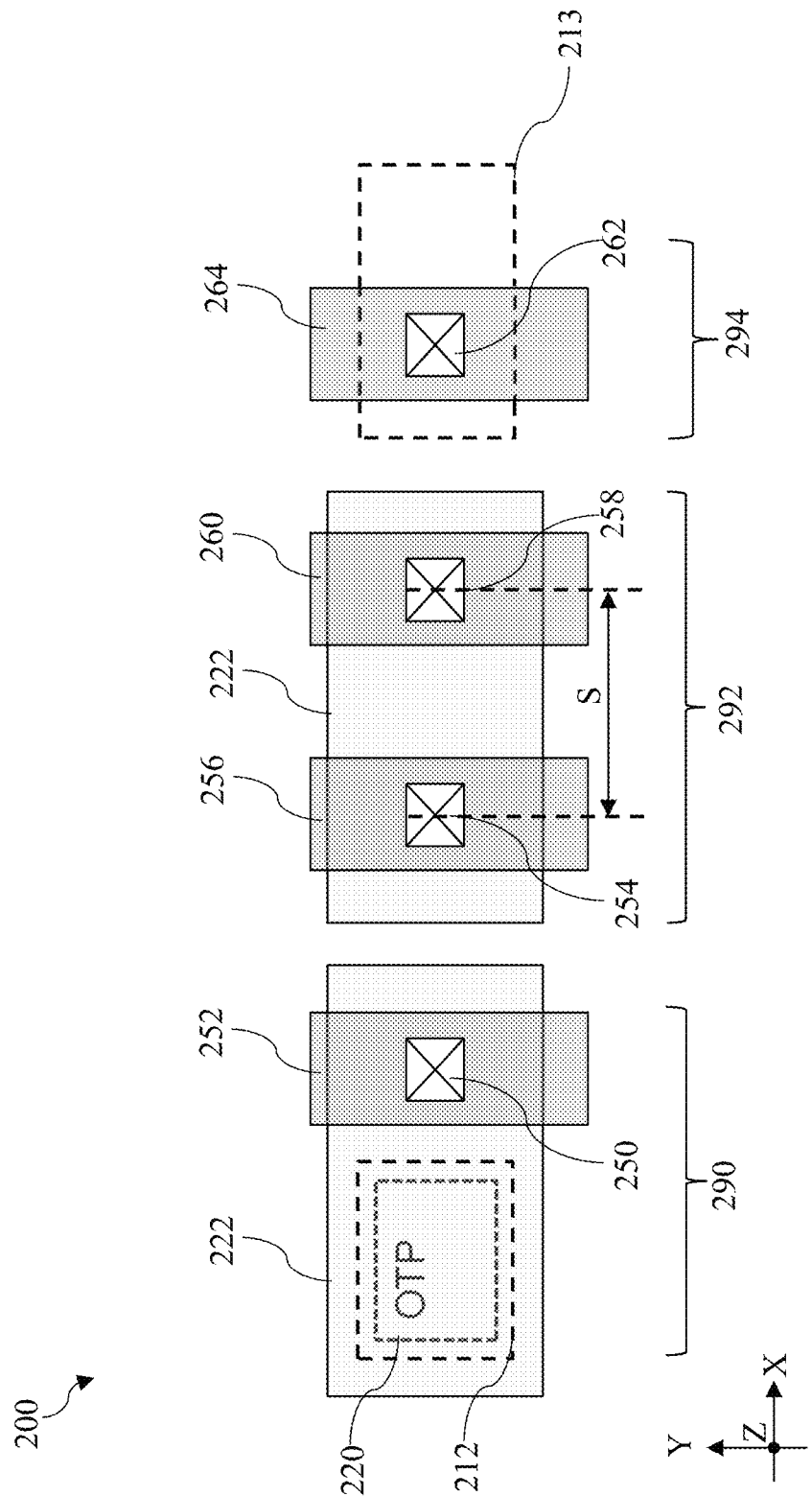
FIG. 13 illustrates a schematic top view of the workpiece shown in FIG. 12, according to various aspects of the present disclosure.
Figure 14:
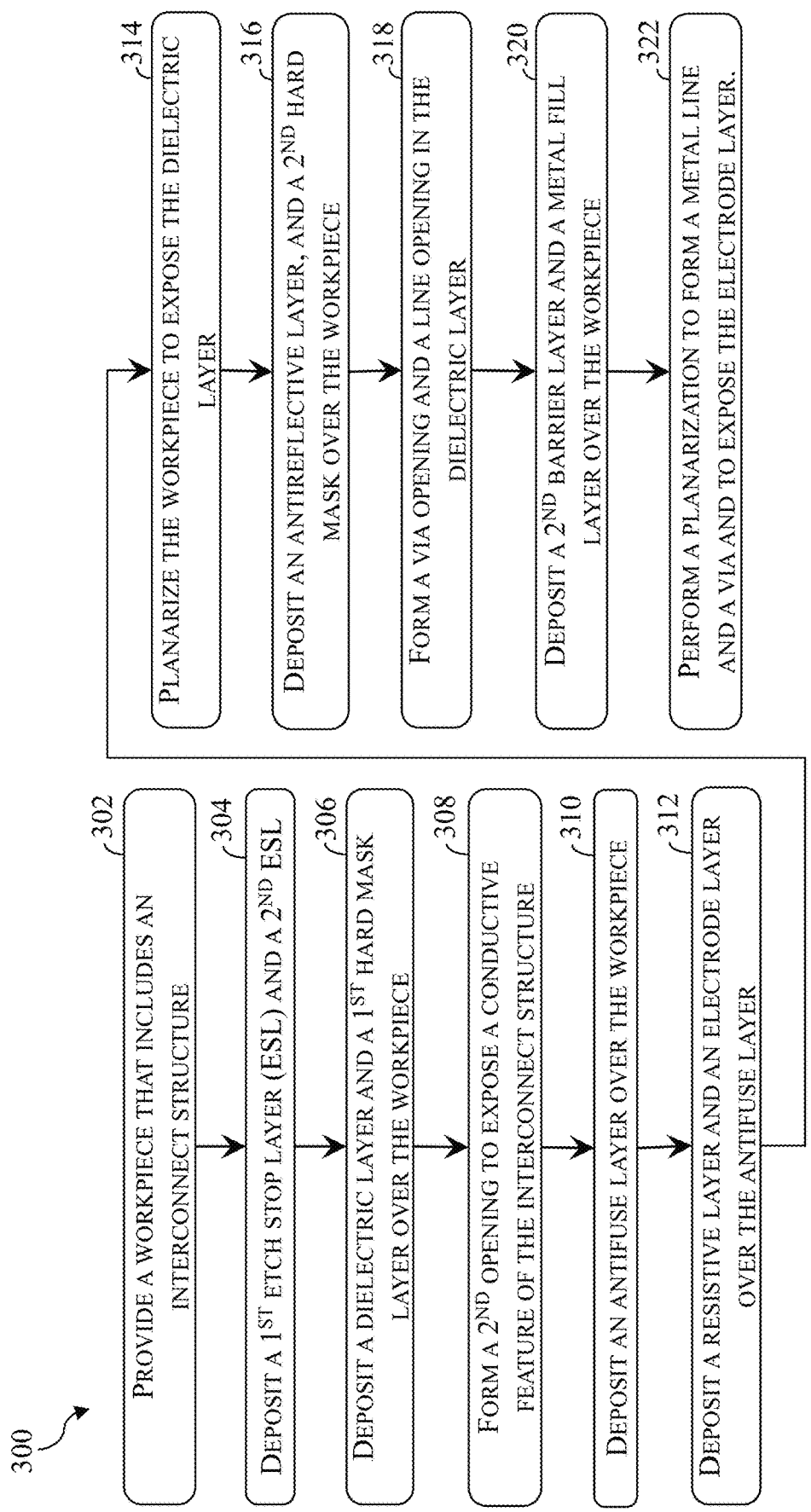
FIG. 14 is a flowchart illustrating a method of fabricating a device structure according to various aspects of the present disclosure.

Reference is made to FIGS. 12 and 13, which illustrate the electrical connections in cross-sectional and schematic top views. In the OTP region 290, the first metal line 252 is electrically coupled to the resistive layer 222 by way of the first via 250. The resistive layer 222 in the OTP region 290 is spaced apart from the first conductive feature 212 by the antifuse layer 220. With the first conductive feature 212 serving as the bottom electrode, the antifuse layer 220 serving as the antifuse, and the resistive layer 222 serving as the top electrode, they collectively form an OTP memory device. The antifuse layer 220 may be broken down by applying a programming voltage to the first metal line 252. In the Hi-R region 292, the second metal line 256 is electrically coupled to the resistive layer 222 by way of the second via 254 and the third metal line 260 is electrically coupled to the resistive layer 222 by way of the third via 258. In the Hi-R region 292, the resistive layer 222 serves as a Hi-R resistor between the second via 254 and the third via 258. The spacing S between the second via 254 and the third via 258, a thickness of the resistive layer 222 and the resistivity of the resistive layer 222 determine a resistance of the Hi-R resistor. In the logic region 294, the fourth metal line 264 is electrically coupled to the second conductive feature 213 by way of the fourth via 262. It can be seen that electrical signals pass directly through the fourth via 262 without any resistive element or antifuse layer.

In embodiments where Hi-R resistors are not needed, alternative methods, such as method 300, may be used and the resulting device structure 200 does not include a Hi-R region. Method 300 will be described in conjunction with fragmentary cross-sectional views in FIGS. 15-27. For ease of reference, features in FIGS. 15-27 that are similar to those shown in FIGS. 2-13 may be referred to using the same reference numerals. Additionally, for brevity, features that have been described above with respect to method 100 may not be repeated.

Figure 15:
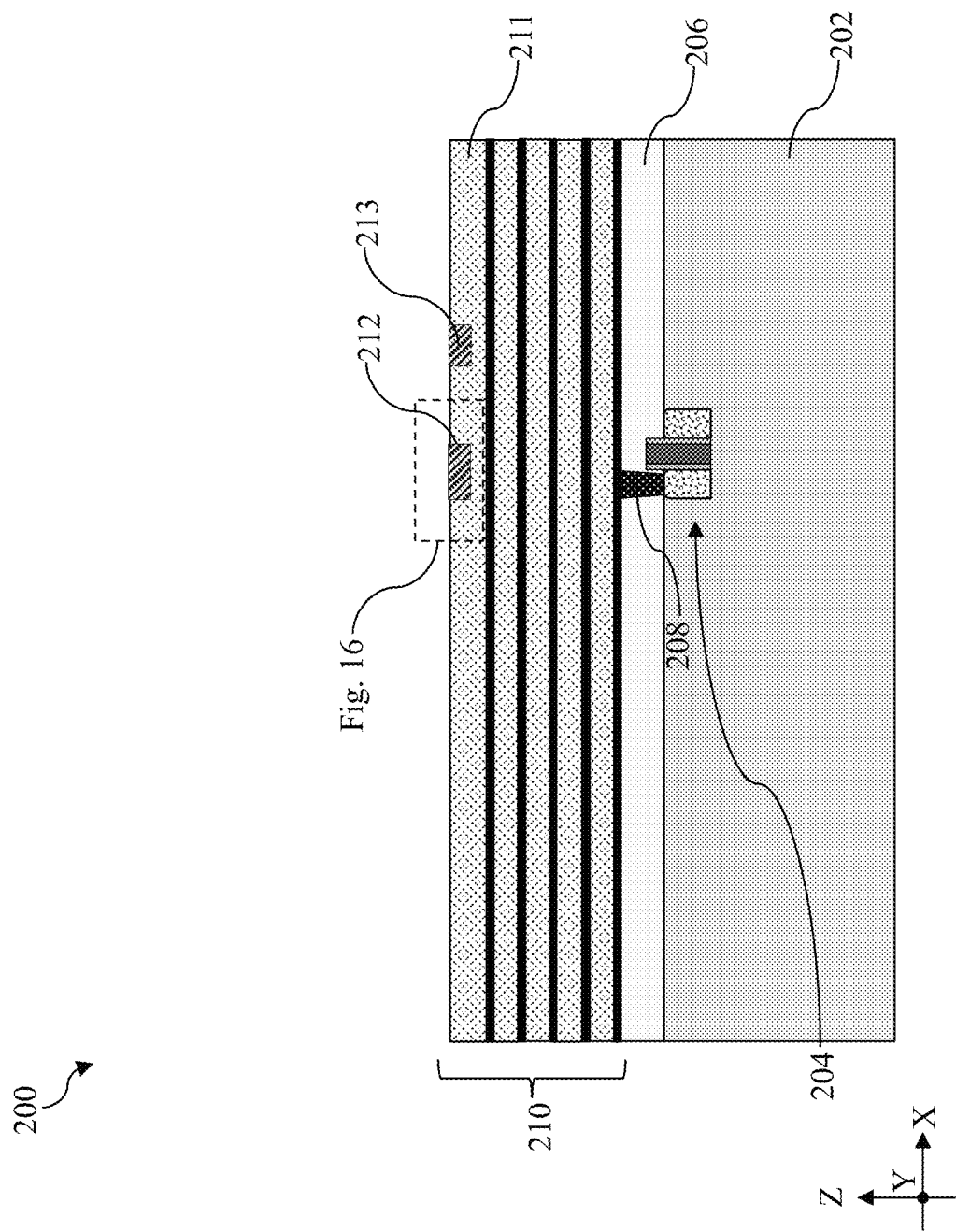
FIGS. 15-27 illustrate diagrammatic fragmentary cross-sectional views of a workpiece undergoing various stages of fabrication according to the method of FIG. 14, according to various aspects of the present disclosure.

Referring to FIGS. 14 and 15, method 300 includes a block 302 where a workpiece 200 is received. Similar to the workpiece 200 shown in FIG. 2, the workpiece 200 in FIG. 15 includes a substrate 202 and an interconnect structure 210 disposed over the substrate 202. The workpiece 200 further includes a transistor 204 formed on the substrate 202. The transistor 204 may be a multi-gate device, such as a fin-like field effect transistor (FinFET) or a multi-bridge-channel (MBC) transistor. The transistor 204 includes source/drain features 204SD and a gate structure 204G disposed between the source/drain features 204SD. The workpiece 200 includes middle-end-of-line (MEOL) features to electrically connect the transistor to the interconnect structure 210. In the depicted embodiments, the transistor 204 in the workpiece 200 includes a source contact 208 over one of the source/drain features 204SD. The source contact 208 is disposed in an interlayer dielectric (ILD) layer 206.

Figure 16:
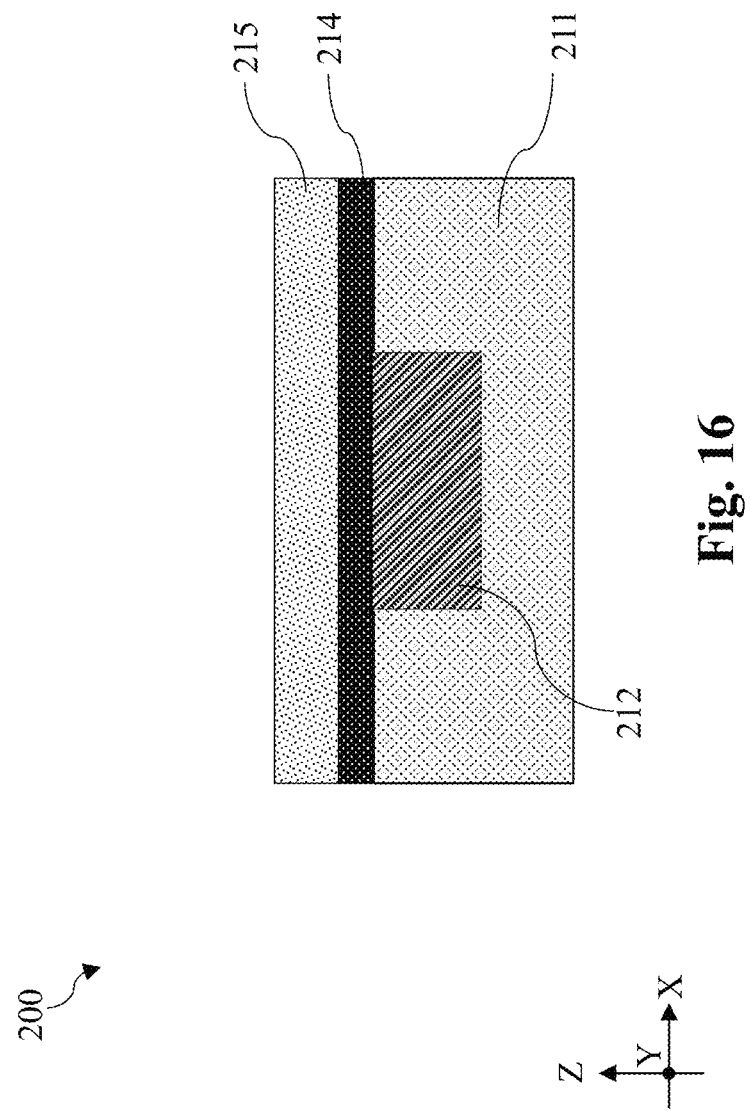

Referring to FIGS. 14 and 16, method 300 includes a block 304 where a first etch stop layer (ESL) 214 and a fifth ESL 215 are deposited over the workpiece 200. A composition of the first ESL 214 is different from a composition of the fifth ESL 215. The fifth ESL 215 is disposed on the first ESL 214. In some embodiments, the first ESL 214 may include aluminum oxide, aluminum nitride, or hydrogen-containing silicon carbonitride and the fifth ESL 215 may be nitrogen-free dielectric material, such as silicon oxide or hydrogen-containing silicon oxycarbide. The dotted rectangular area in FIG. 15 is enlarged and illustrated in FIG. 16, which is also a fragmentary cross-sectional view of the workpiece 200. As will be made apparent below, the fifth ESL 215 is not subject to patterning to form different regions. For that reason, a thickness of the fifth ESL 215 is substantially smaller than a thickness of the second ESL 216. In some examples, the thickness of the fifth ESL 215 is between about 50 nm and about 200 nm and the thickness of the second ESL 216 is between about 100 nm and about 400 nm.

Figure 17:
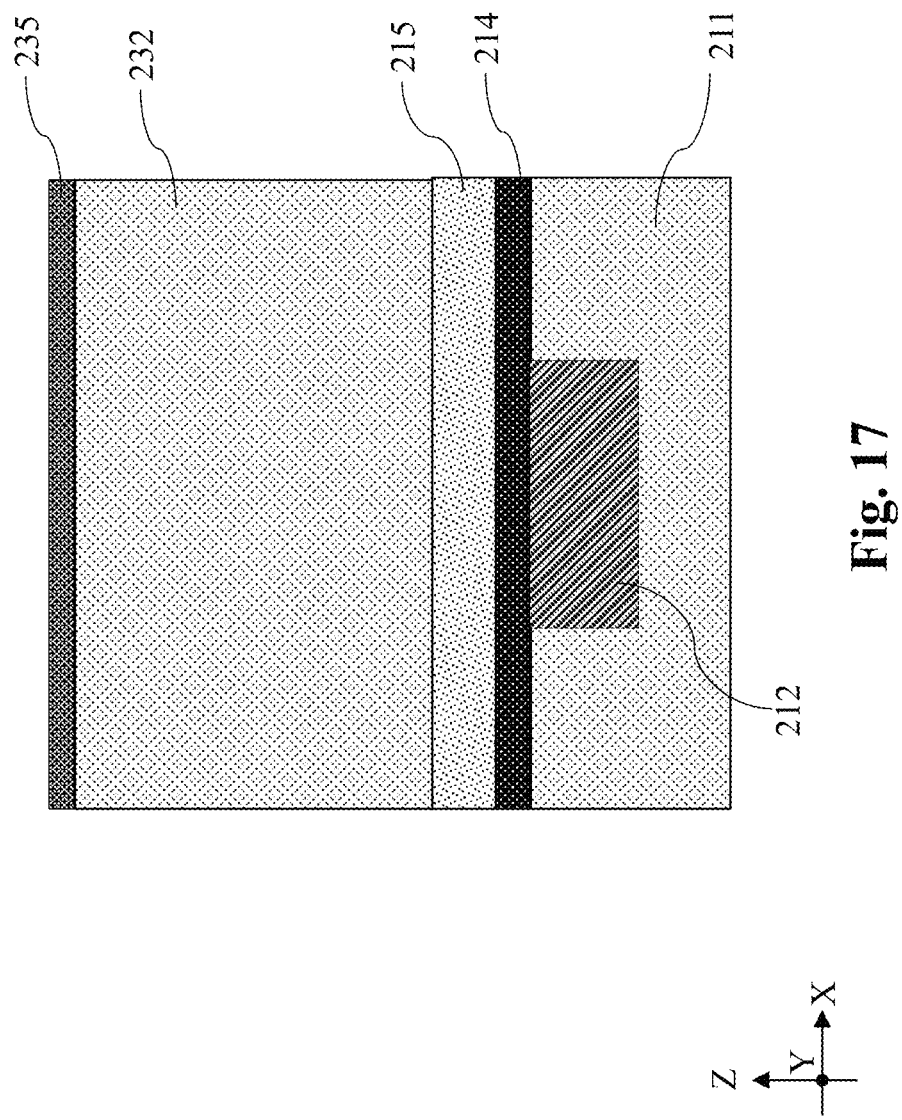

Referring to FIGS. 14 and 17, method 300 includes a block 306 where an IMD layer 232 and a top hard mask layer 235 are deposited over the workpiece 200. Like the other IMD layers in the interconnect structure 210, the IMD layer 232 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silica glass (BSG), and/or other suitable dielectric materials. The IMD layer 232 may be deposited using spin-on coating or FCVD. Then the top hard mask layer 235 is deposited over the IMD layer 232 using CVD, PECVD, or a suitable method. In some embodiments, the top hard mask layer 235 may include a nitrogen-free antireflective coating (NFARC) layer similar to the NFARC layer 234, titanium nitride (TiN), or silicon oxide. The top hard mask layer 235 may be deposited using CVD, PECVD, or a suitable deposition method.

Figure 18:
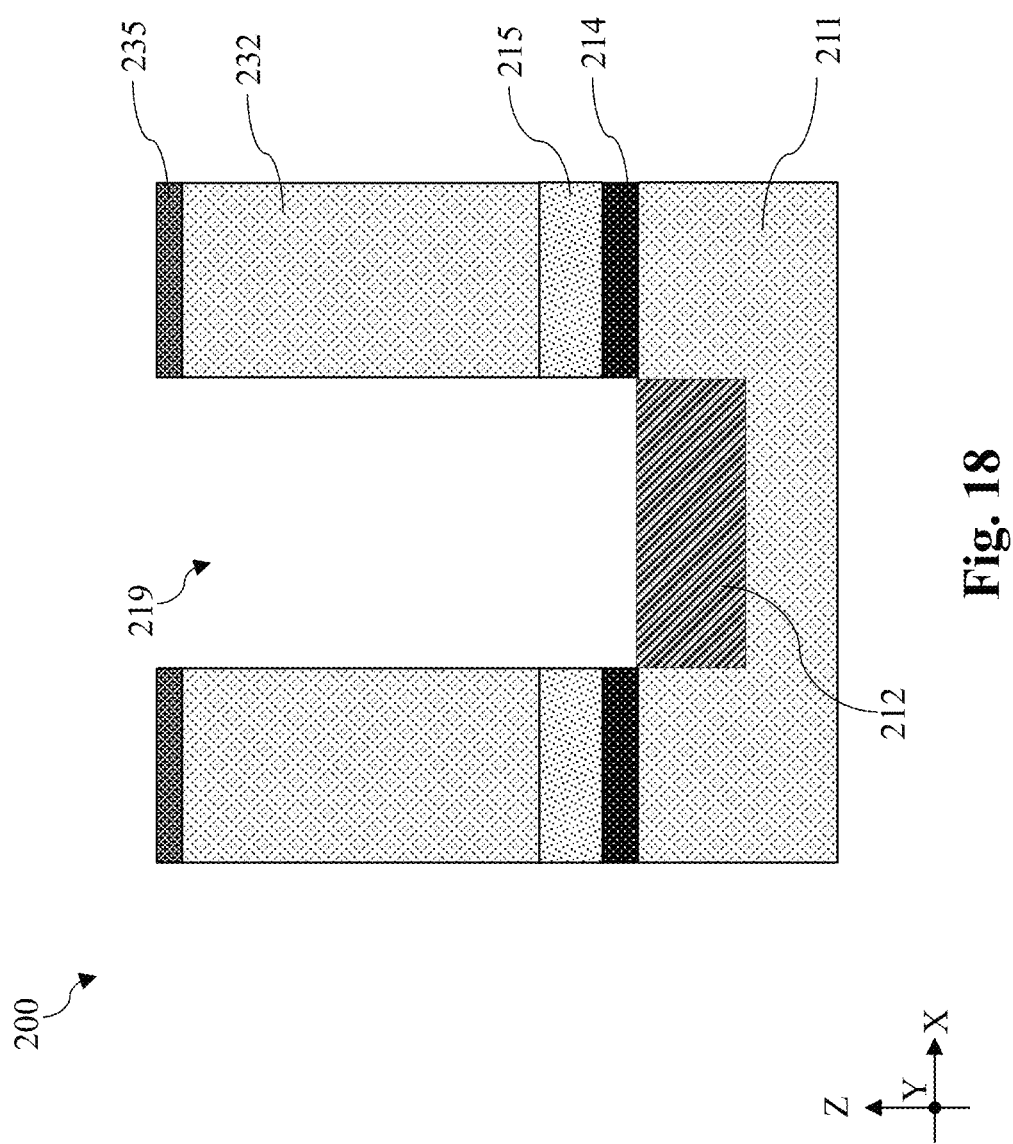
Figure 19:
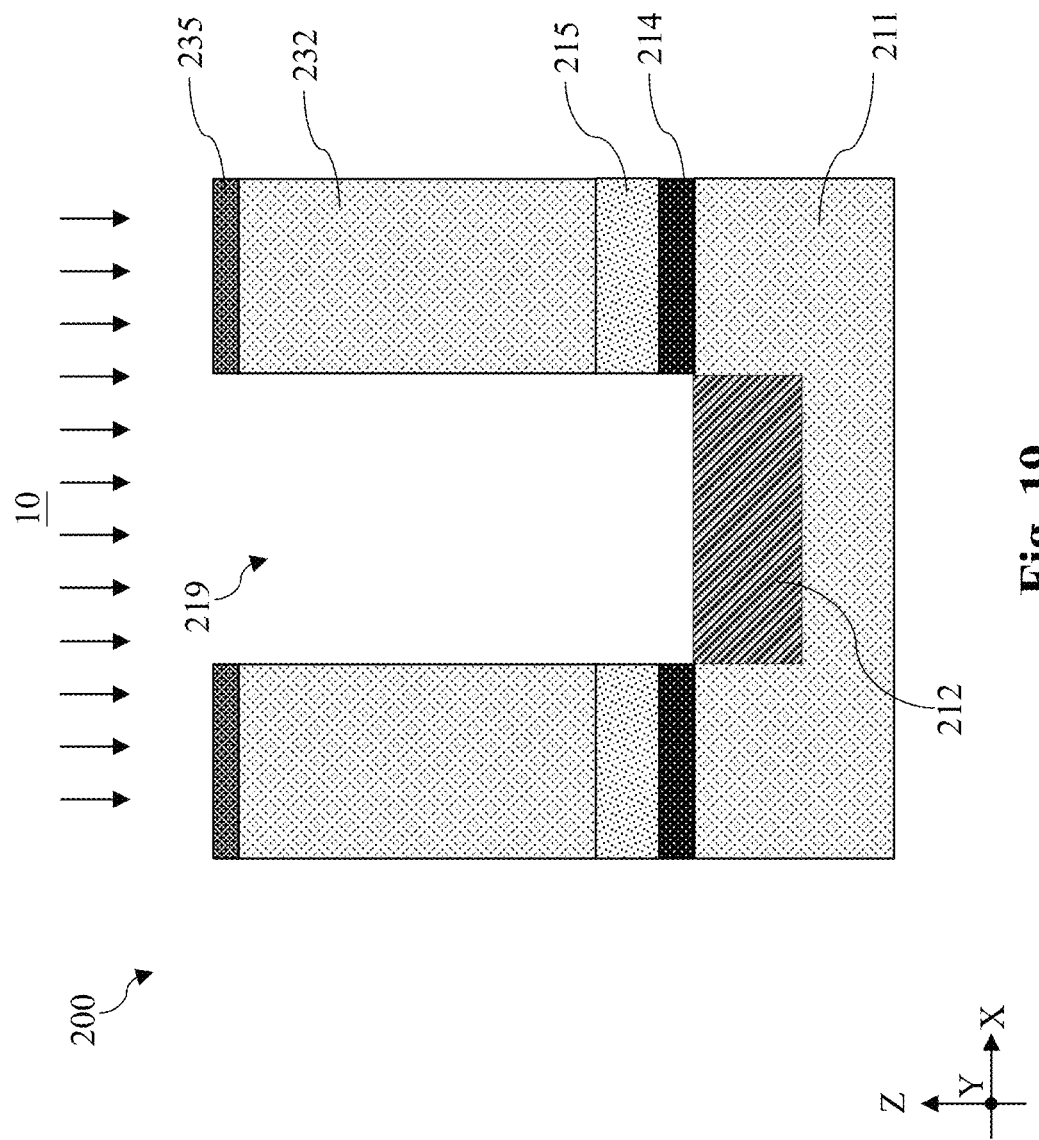

Referring to FIGS. 14 and 18, method 300 includes a block 308 where a second opening 219 is formed in the workpiece 200 to expose the first conductive feature 212. In an example process, a bottom antireflective coating (BARC) layer is deposited over the top hard mask layer 235 using spin-on coating or FCVD and a photoresist layer is deposited over the BARC layer using spin-on coating. After the deposition of the photoresist layer, photolithography processes are performed to pattern the photoresist layer. The patterned photoresist layer is then used as an etch mask in etching the BARC layer to form a patterned BARC layer. The patterned BARC layer is then applied as an etch mask to etch the top hard mask layer 235, the IMD layer 232, the fifth ESL 215, and the first ESL 214, to form the second opening 219. At block 308, the etch process may be an anisotropic etch, such as a reactive-ion-etching (RIE) process that uses oxygen, hydrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. After the first ESL 214 is breached by the anisotropic etching process, a wet cleaning process may be performed to remove undesirable debris. The wet cleaning process may include use of deionized (DI) water, a standard clean 1 (SC1) solution, a standard clean 2 (SC2) solution, or a combination thereof. After the wet cleaning process, a top surface of the first conductive feature 212 is exposed in the second opening 219. As shown in FIG. 18, the second opening 219 extends through the IMD layer 232, the fifth ESL 215 and the first ESL 214. To remove solvents used in the wet clean process, the workpiece 200 may be subject to a bake process 10 as shown in FIG. 19. In some implementations, the bake process 10 includes a temperature between about 250° C. and about 350° C.

Figure 20:
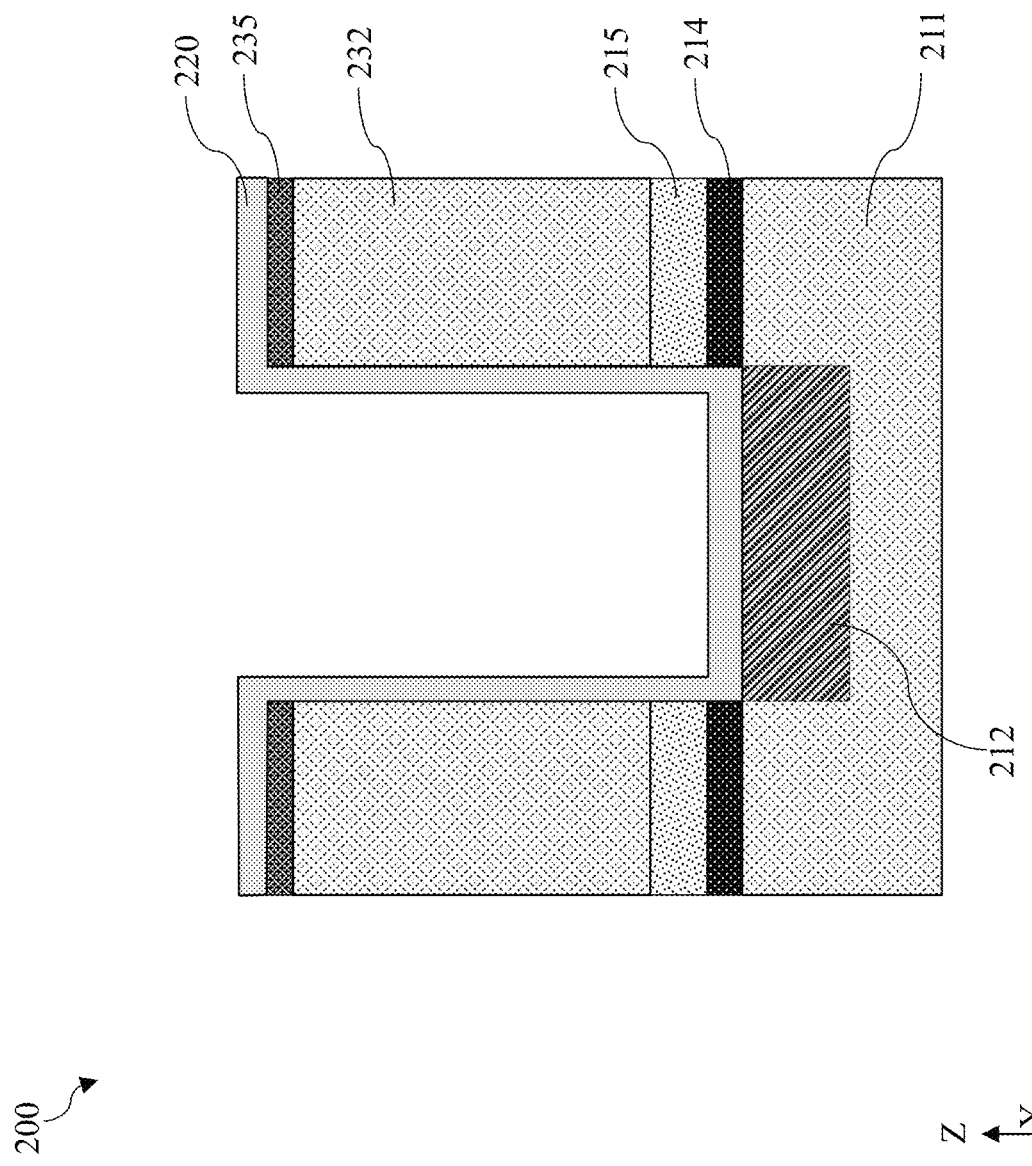
Figure 21:
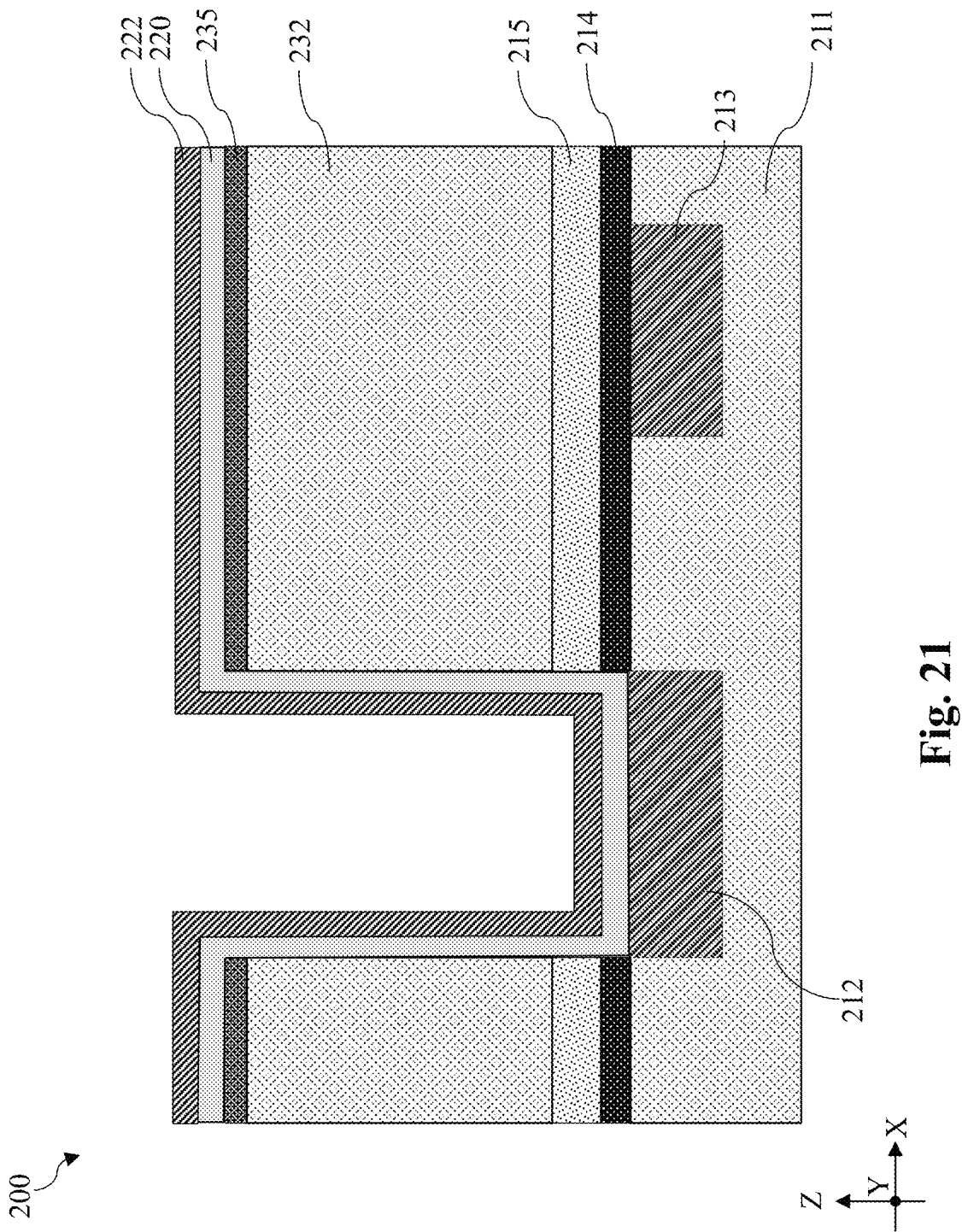

Referring to FIGS. 14, 19 and 20, method 300 includes a block 310 where an antifuse layer 220 is deposited over the workpiece 200. After the bake process 10, the antifuse layer 220 may be conformally deposited over the workpiece 200 using atomic layer deposition (ALD), CVD, or plasma-enhanced CVD (PECVD), as shown in FIG. 20. The antifuse layer 220 may include a high-dielectric-constant (high-k) dielectric layer that has a dielectric constant greater than that of silicon dioxide (about 3.9). In some embodiments, the breakdown layer 220 may include hafnium oxide (HfO), aluminum oxide (AlO), aluminum nitride (AlN), titanium oxide (TiO), hafnium zirconium oxide (HfZrO), tantalum oxide (TaO), hafnium aluminum oxide (HfAlO), hafnium silicon oxide (HfSiO), zirconium oxide (ZrO), zirconium silicon oxide (ZrSiO), lanthanum oxide (LaO), yttrium oxide (YO), strontium titanium oxide (SrTiO), barium titanium oxide (BaTiO), barium zirconium oxide (BaZrO), hafnium lanthanum oxide (HfLaO), lanthanum silicon oxide (LaSiO), aluminum silicon oxide (AlSiO), hafnium tantalum oxide (HfTaO), hafnium titanium oxide (HfTiO). In one embodiment, the antifuse layer 220 may be formed of aluminum oxide (AlO). Depending on the design, the antifuse layer 220 may have a thickness between about 10 Å and about 100 Å. Given the same quality of the antifuse layer 220 and a fixed area of the antifuse layer 220, the thickness of the antifuse layer 220 substantially determines the breakdown voltage of the OTP memory device it forms. For example, when the breakdown layer 220 has a thickness about 20 Å, the breakdown voltage of the antifuse layer 220 (or the OTP memory device it forms) is between about 1.5 V and about 2 V. When the antifuse layer 220 is thinner than 10 Å, the antifuse layer 220 may experience premature breakdown at a lower-than-design voltage. When the antifuse layer 220 is thicker than 100 Å, the breakdown voltage of the antifuse layer 220 may be higher than the highest operating voltage of the device structure 200. Because the antifuse layer 220 is configured to break down to form an electrical connection, the antifuse layer 220 may also be referred to as a breakdown layer 220.

Figure 22:
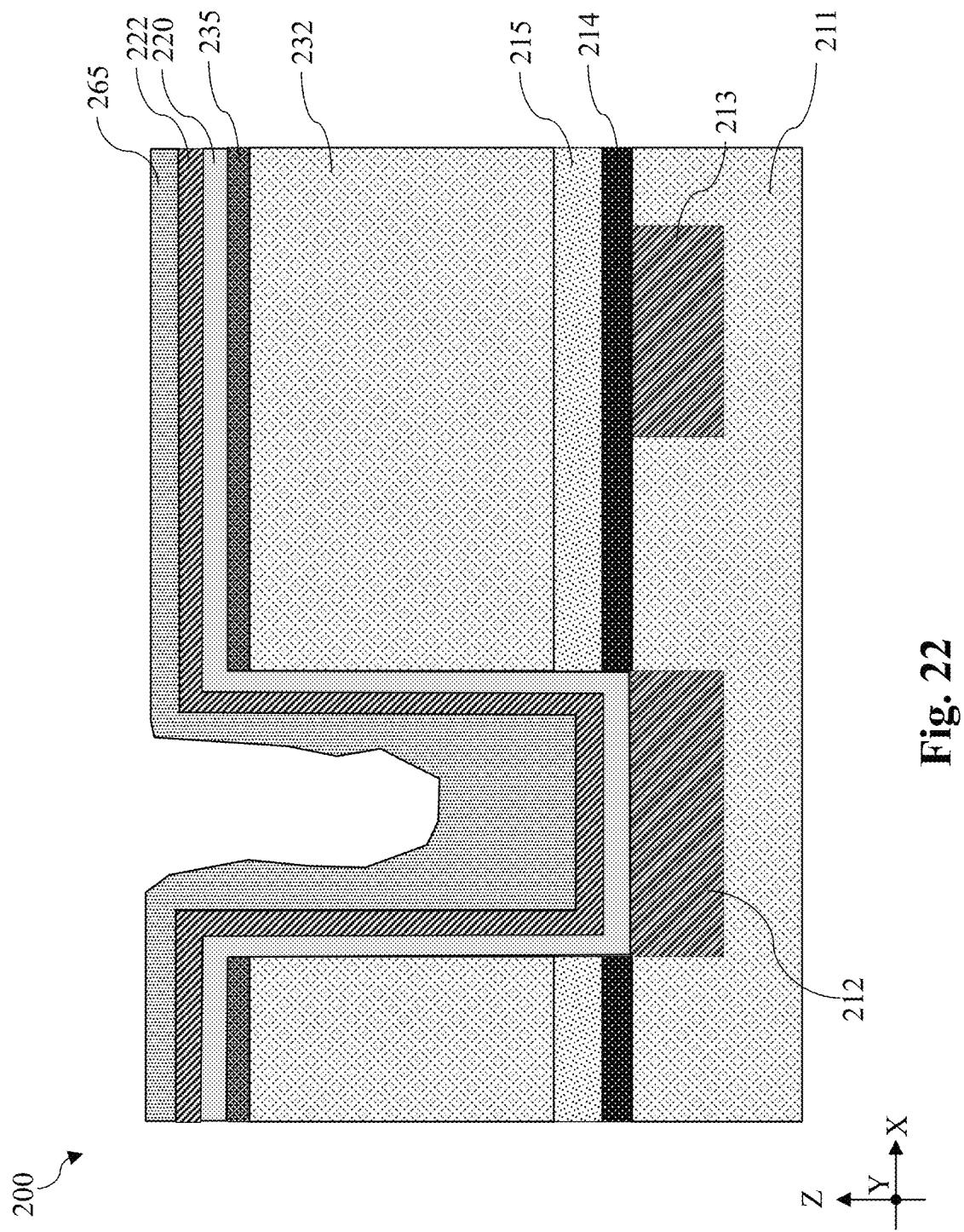
Figure 23:
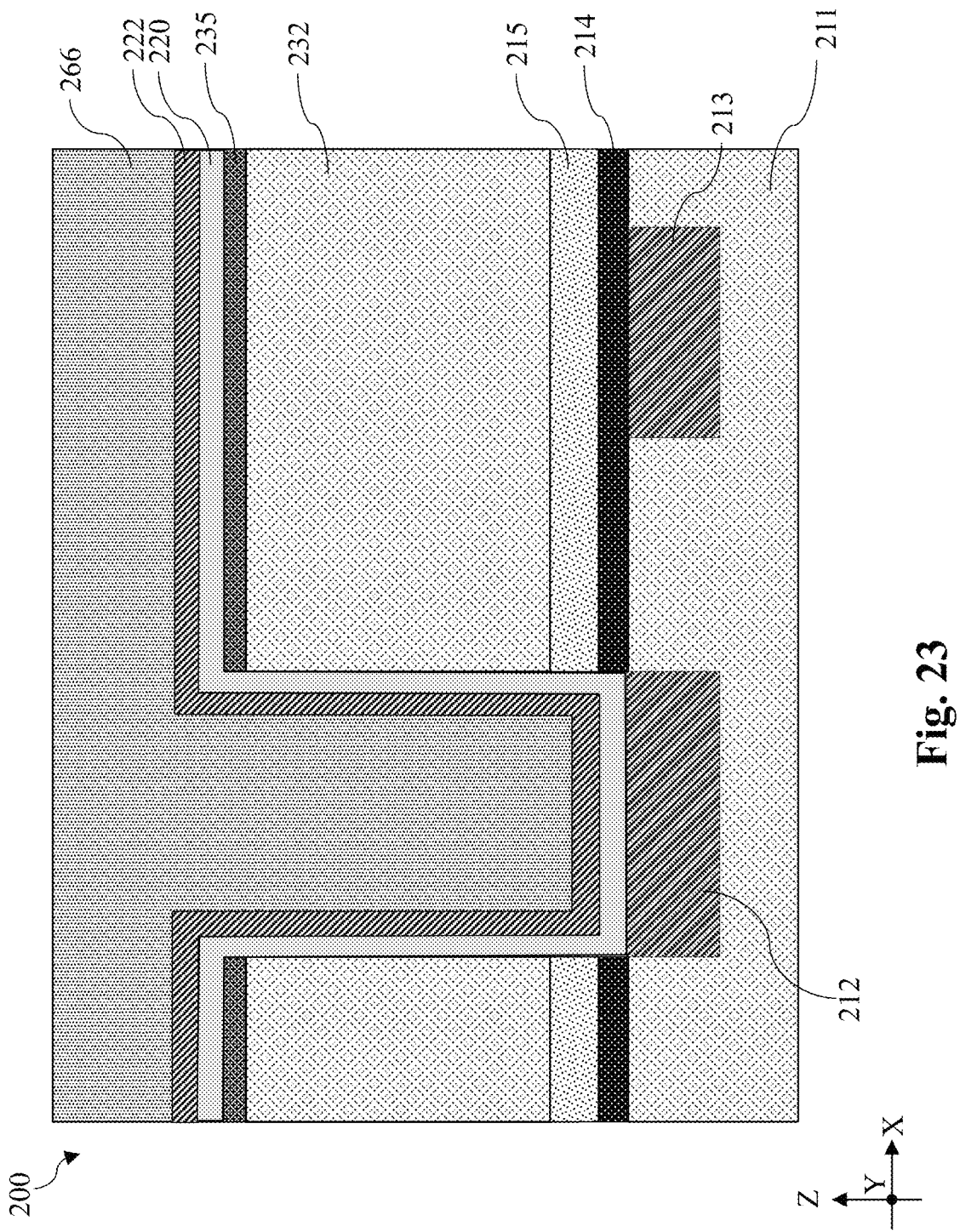

Referring to FIGS. 14, 21, 22, and 23, method 300 includes a block 312 where a resistive layer 222 and an electrode layer 266 are deposited over the antifuse layer 220. The resistive layer 222 may be a metal layer or a conductive metal nitride layer. In some embodiments, the resistive layer 222 may include titanium nitride (TiN), tantalum nitride (TaN), tungsten (W), nickel (Ni), titanium (Ti), ruthenium (Ru), cobalt (Co), copper (Cu), other refractory metals, or other suitable metal materials or a combination thereof. The resistive layer 222 may be conformally deposited over antifuse layer 220 and the second opening 219 by ALD, PVD, CVD, e-beam evaporation, or other suitable process. In the embodiment depicted in FIG. 21, the resistive layer 222 may include tantalum nitride (TaN). After the deposition of the resistive layer 222, a seed layer 265 is deposited over the workpiece 200, including over the second opening 219, using PVD, as shown in FIG. 22. The seed layer 265 may include copper (Cu), titanium (Ti), or both. With the seed layer 265 is in place, the electrode layer 266 may be deposited over the seed layer 265 using electroplating. The electrode layer 266 may include copper (Cu).

Figure 24:
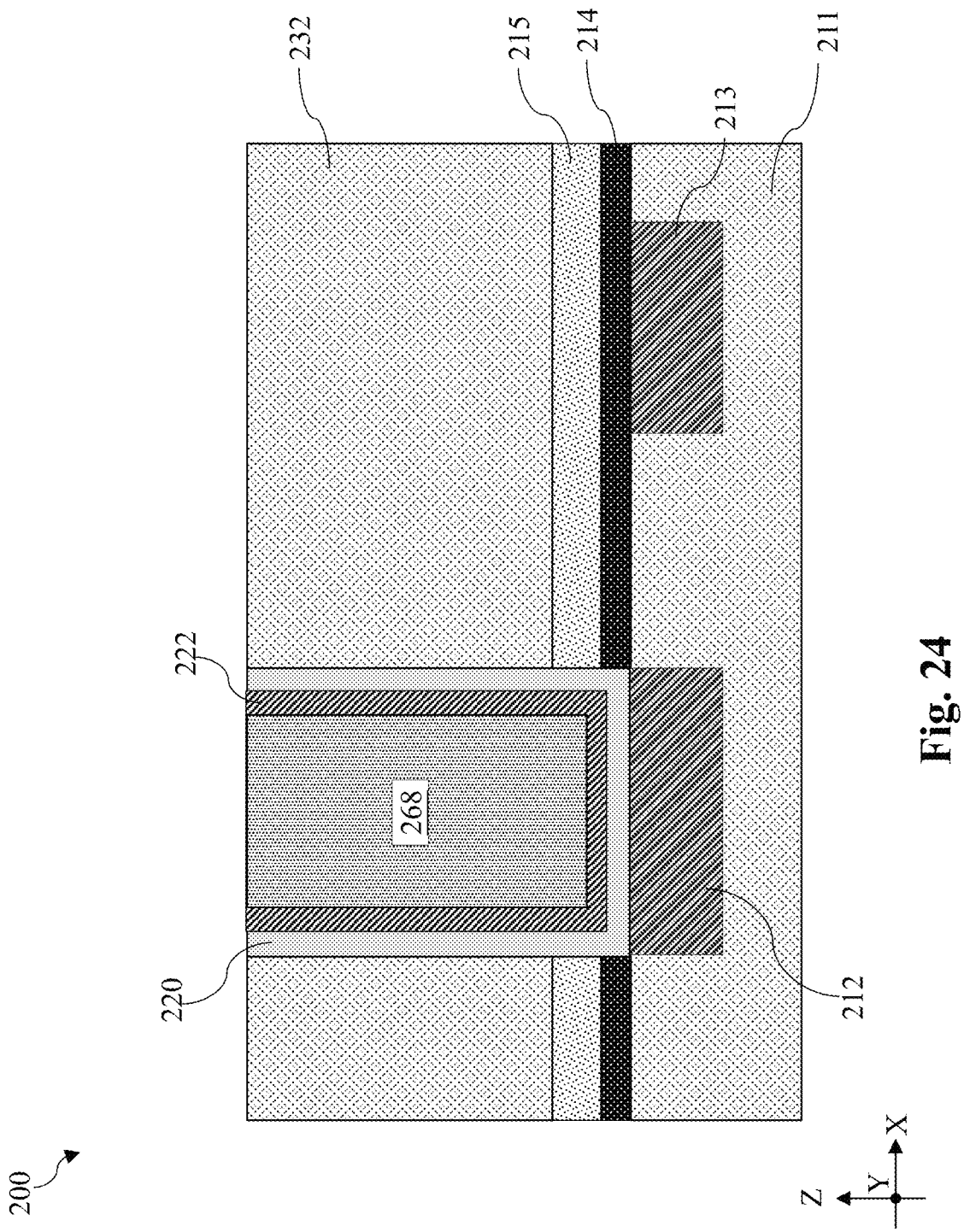

Referring to FIGS. 14 and 24, method 300 includes a block 314 where the workpiece 200 is planarized to expose the IMD layer 232. After the deposition of the resistive layer 222 and the electrode layer 266, the workpiece 200 is planarized using, for example, chemical mechanical polishing (CMP) to remove the excess resistive layer 222, the excess electrode layer 266, and the top hard mask layer 235, and a portion of the IMD layer 232. As shown in FIG. 24, after the planarization of the workpiece 200, a top electrode 268 is formed directly over the first conductive feature 212. Top surfaces of the antifuse layer 220, the resistive layer 222, and the top electrode 268 are coplanar with a top surface of the IMD layer 232.

Figure 25:
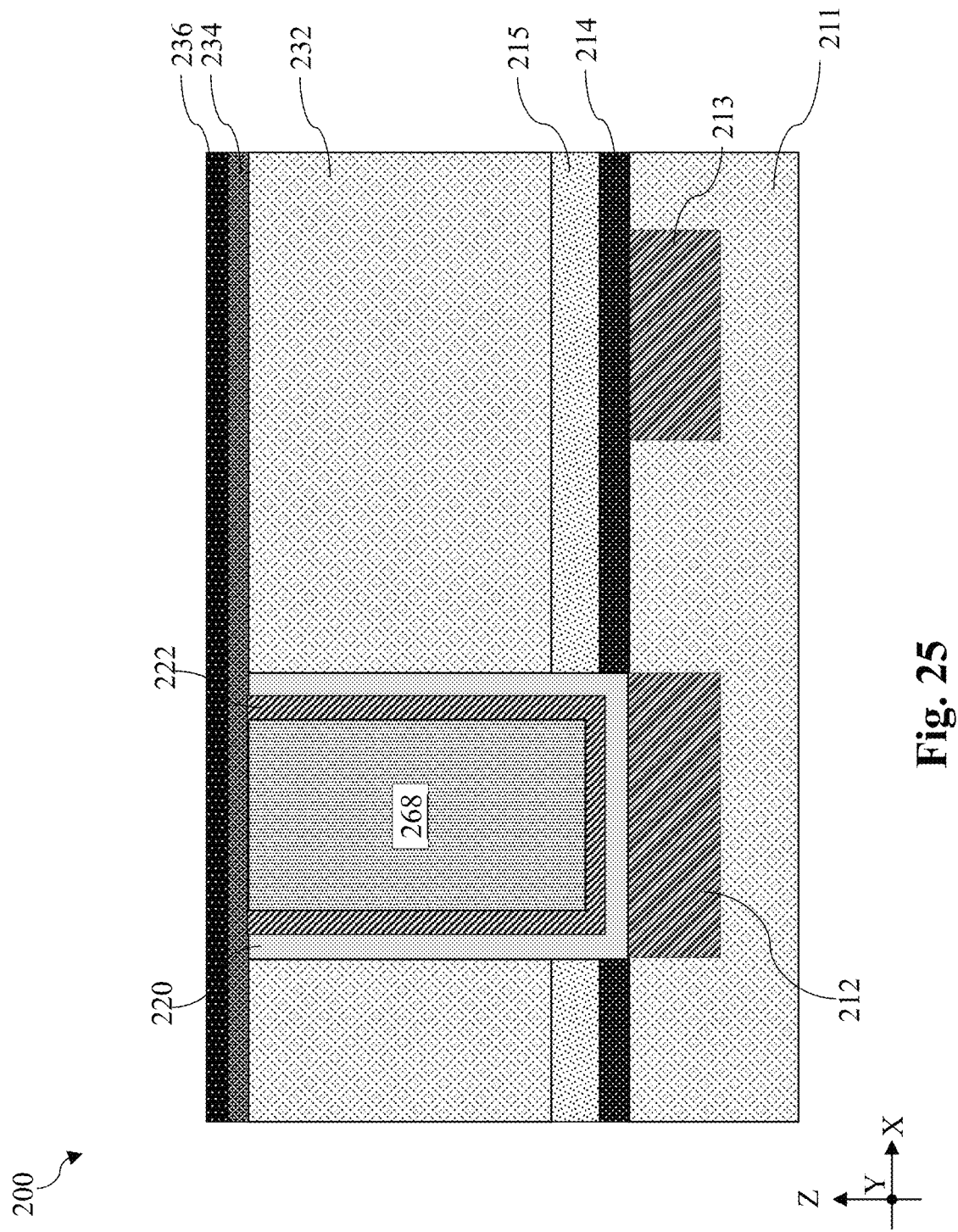

Referring to FIGS. 14 and 25, method 300 includes a block 316 where an antireflective layer 234 and a hard mask layer 236 are deposited over the workpiece 200. At block 316, the antireflective layer 234 is deposited over the IMD layer 232 and the top electrode 268 using CVD, PECVD, or a suitable method. In some embodiments, the antireflective layer 234 may be free of nitrogen and may include silicon, carbon, oxygen, or hydrogen. In these embodiments, the antireflective layer 234 is free of nitrogen such that it has different etch selectivity than the hard mask layer 236. This arrangement facilitates etch end point detection and control. In some embodiments, the hard mask layer 236 includes titanium nitride (TiN), silicon carbide (SiC), or tungsten (W). In one embodiment, the hard mask layer 236 includes titanium nitride. The hard mask layer 236 may be deposited using metal organic CVD (MOCVD), CVD, physical vapor deposition (PVD), or a suitable deposition method.

Figure 26:
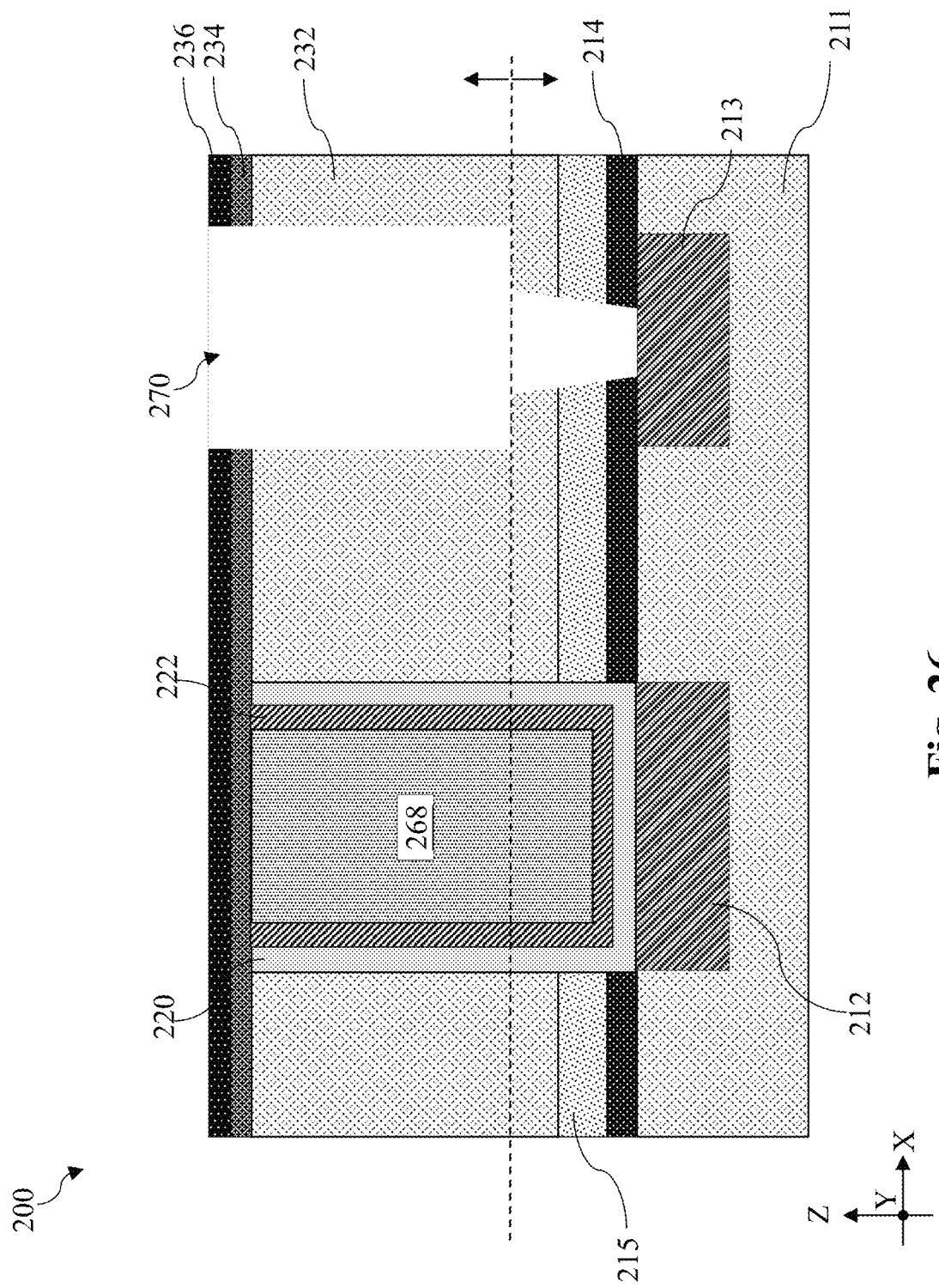

Referring to FIGS. 14 and 26, method 300 includes a block 318 where a fifth contact opening 270 is formed in the IMD layer 232. Using a combination of photolithography processes and etch processes, the fifth contact opening 270 is formed in the IMD layer 232. As illustrated by the dotted line, the fifth contact opening 270 includes a lower via opening portion and an upper line opening portion. The line opening portions extend lengthwise along the Y direction while the via openings provide vertical connections. The fifth contact opening shown in FIG. 26 may be formed using a two-step etch process. The fifth contact opening 270 is disposed directly over the second conductive feature 213. The lower via portion of the fifth contact opening 270 extends through the IMD layer 232, the fifth ESL 215 and the first ESL 214 to expose the second conductive feature 213. The upper line portion of the fifth contact opening 270 extends through the hard mask layer 236, the antireflective layer 234, and a portion of the IMD layer 232.

Figure 27:
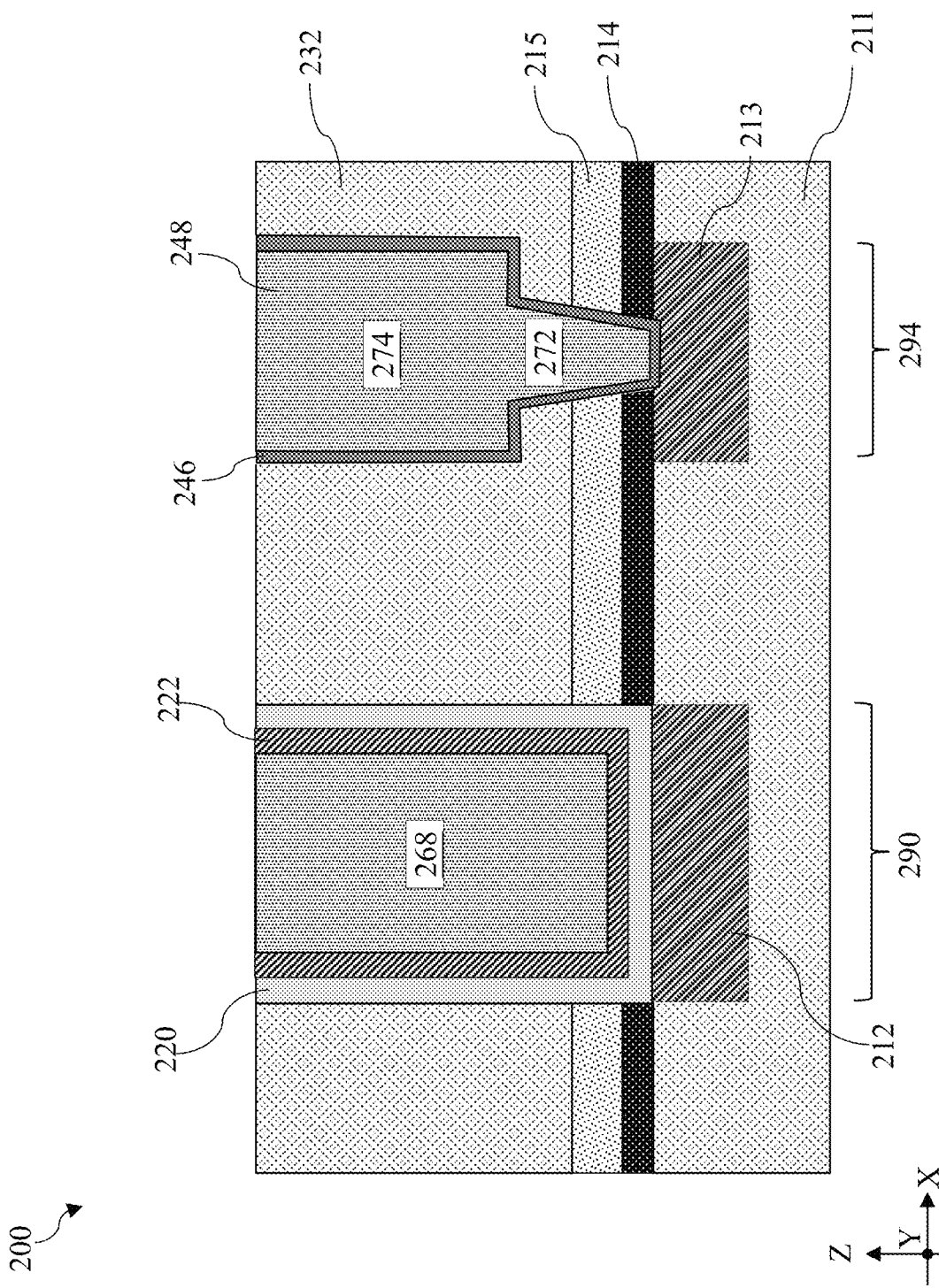

Referring to FIGS. 14 and 27, method 300 includes a block 320 where a barrier layer 246 and a metal fill layer 248 are deposited over the workpiece 200. The barrier layer 246 may include manganese nitride (MnN), titanium nitride (TiN) or tantalum nitride (TaN) and may be deposited using ALD, CVD, or a suitable method. Then the metal fill layer 248 is deposited over the barrier layer 246. The metal fill layer 248 may include copper (Cu) and may be deposited using physical vapor deposition (PVD), electroless plating, electroplating, or a suitable method. In some embodiments, when the metal fill layer 248 is deposited using electroplating, a seed layer may be deposited over the barrier layer before the metal fill layer 248 is deposited. The seed layer may include copper and may be deposited using PVD. Although not explicitly shown in the figures, in some embodiments, a liner may be deposited on the barrier layer 246 before subsequent layers are deposited. In those embodiments, the liner may include cobalt (Co), nickel (Ni), or ruthenium (Ru). The liner may be deposited using PVD. As shown in FIG. 27, the barrier layer 246 in the fifth contact opening 270 is in direct contact with the IMD layer 232, the fifth ESL 215, and the first ESL 214. The barrier layer 246 spaces the metal fill layer 248 from the IMD layer 232, the fifth ESL 215, and the first ESL 214.

Referring to FIGS. 14 and 27, method 300 includes a block 322 where the workpiece 200 is planarized to form metal lines and vias. After the deposition of the barrier layer 246 and the metal fill layer 248, the workpiece 200 is planarized using, for example, chemical mechanical polishing (CMP) to remove the excess barrier layer 246, the excess metal fill layer 248, the hard mask layer 236, the antireflective layer 234, and a portion of the IMD layer 232. As shown in FIG. 27, after the planarization of the workpiece 200, a fifth via 272 an a fifth metal line 274 are formed. A top surface of the fifth metal line 274 is coplanar with top surfaces of the IMD layer 232, the antifuse layer 220, the resistive layer 222, and the top electrode 268. The fifth metal line 274 extends lengthwise along the Y direction.

Figure 28:
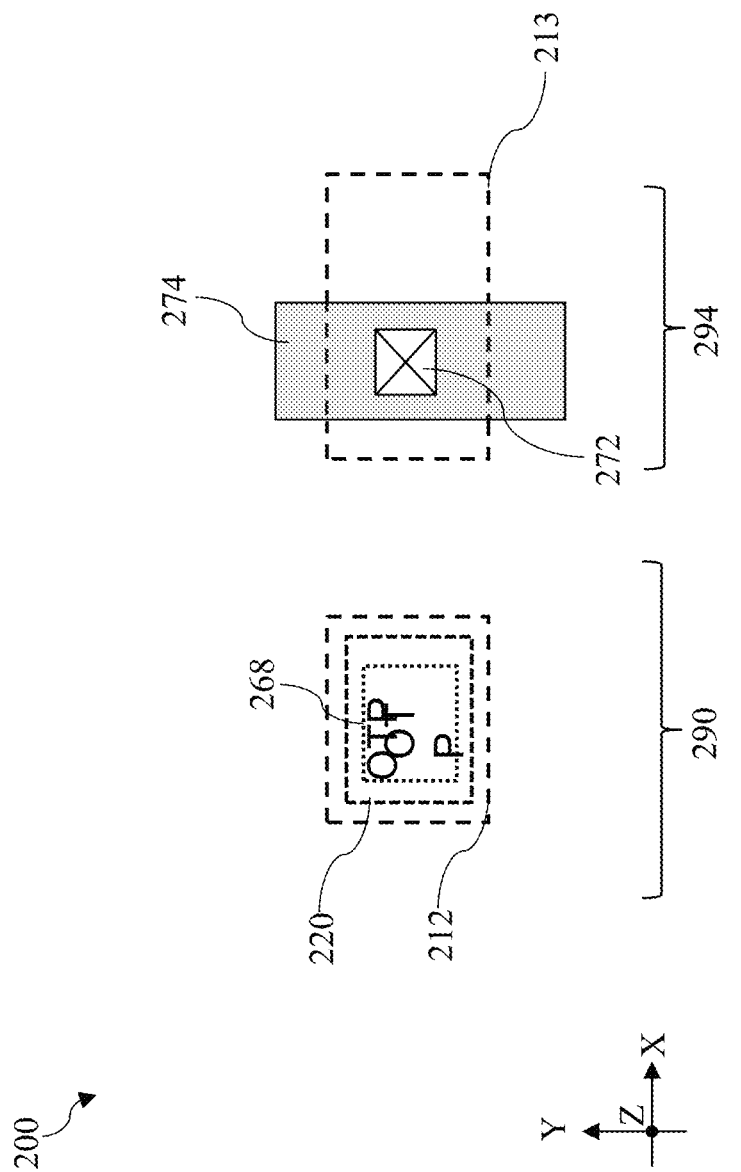
FIG. 28 illustrates a schematic top view of the workpiece shown in FIG. 27, according to various aspects of the present disclosure.

Reference is made to FIGS. 27 and 28, which illustrate the electrical connections in cross-sectional and schematic top views. The device structure 200 in FIGS. 27 and 28 include an OTP region 290 and a logic region 294. Unlike the device structure in FIGS. 12 and 13, the device structure 200 in FIGS. 27 and 28 does not include a Hi-R region between the OTP region 290 and the logic region 294. In the OTP region 290, the antifuse layer 220 is vertically disposed between the top electrode 268 and the first conductive feature 212. In the embodiment depicted in FIG. 27, the resistive layer 222 in the OTP region 290 serves as a barrier layer that prevents oxidation and electromigration of the top electrode 268. That is, the first conductive feature 212, the antifuse layer 220 and the top electrode 268 collectively form an OTP memory device. The antifuse layer 220 may be broken down by applying a programming voltage to the fifth metal line 274. In the logic region 294, the fifth metal line 274 is electrically coupled to the second conductive feature 213 by way of the fifth via 272. It can be seen that electrical signals pass directly through the fifth via 272 without any resistive element or antifuse layer.

Thus, in one aspect, the present disclosure provides an interconnect structure. The interconnect structure includes a first dielectric layer, a first conductive feature and a second conductive feature in the first dielectric layer, a first dielectric feature disposed directly on the first conductive feature, a first etch stop layer (ESL) disposed over the first dielectric layer and the second conductive feature, a first conductive layer disposed on and in contact with the first dielectric feature, a second ESL disposed over the first conductive layer, a second dielectric layer disposed directly on the first ESL and the second ESL, a first via extending through the second dielectric layer and the second ESL to contact with the first conductive feature, and a second via extending through the second dielectric layer and the first ESL to contact with the second conductive feature.

In some embodiments, the interconnect structure further includes a third ESL vertically sandwiched between the second conductive feature and the first ESL. In some embodiments, the interconnect structure further includes a fourth ESL vertically sandwiched between the second ESL and the first conductive layer. In some implementations, the first ESL and the second ESL include silicon oxide or hydrogen-containing silicon oxycarbide and the third ESL and the fourth ESL include aluminum oxide, aluminum nitride, or hydrogen-containing silicon carbonitride. In some instances, the first conductive feature and the second conductive feature include copper and the first conductive layer includes tantalum nitride. In some embodiments, the first dielectric feature includes aluminum oxide. In some embodiments, the interconnect structure further includes a second dielectric feature disposed over a portion of the first ESL between the first dielectric feature and the second via, a second conductive layer disposed on the second dielectric feature, and a fifth ESL disposed over the second conductive layer. A portion of the second dielectric layer spans over the fifth ESL. In some implementations, the interconnect structure further includes a third via extending through the second dielectric layer and the fifth ESL to contact with the second conductive layer, and a fourth via extending through the second dielectric layer and the fifth ESL to contact with the second conductive layer. In some instances, the second dielectric feature includes aluminum oxide and the second conductive layer includes tantalum nitride.

Another aspect of the present disclosure involves an interconnect structure. The interconnect structure includes a first dielectric layer, a first conductive feature and a second conductive feature in the first dielectric layer, a first etch stop layer (ESL) disposed over the first dielectric layer and the second conductive feature, a second ESL disposed over the first ESL, a second dielectric layer disposed over the second ESL, an antifuse layer extending through the second dielectric layer, the second ESL and the first ESL to contact with the first conductive feature, the antifuse layer including an inside surface facing away from the second dielectric layer, the second ESL and the first ESL, a conductive layer extending conformally along the inside surface of the antifuse layer, the conductive layer defining a space spaced apart from the second dielectric layer by the conductive layer and the antifuse layer, and a top electrode disposed within the space. Top surfaces of the second dielectric layer, the antifuse layer, the conductive layer, and the top electrode are coplanar.

In some embodiments, the interconnect structure further includes a contact via extending through the first ESL, the second ESL, and a lower portion of the second dielectric layer to contact with the second conductive feature and a conductive line disposed directly on the contact via and extending through an upper portion of the second dielectric layer. In some implementations, a top surface of the conductive line is coplanar with top surfaces of the second dielectric layer, the antifuse layer, the conductive layer, and the top electrode. In some instances, the first conductive feature, the second conductive feature, and the top electrode include copper. In some embodiments, the antifuse layer includes aluminum oxide. In some instances, the conductive layer includes tantalum nitride. In some embodiments, the first ESL includes aluminum oxide, aluminum nitride, or hydrogen-containing silicon carbonitride and the second ESL includes silicon oxide or hydrogen-containing silicon oxycarbide.

Yet another aspect of the present disclosure involves a method. The method includes receiving a workpiece that includes a first dielectric layer, a first conductive feature and a second conductive feature in the first dielectric layer, a first etch stop layer (ESL) disposed over the first dielectric layer, the first conductive feature and the second conductive feature, a second ESL disposed over the first ESL, a second dielectric layer over the second ESL, forming a first opening through the second dielectric layer, the second ESL and the first ESL to expose the first conductive feature, conformally depositing an antifuse layer over the first opening, conformally depositing a conductive layer over the antifuse layer, forming a top electrode over the conductive layer such that the top electrode is spaced apart from the second dielectric layer, the second ESL and the first ESL by the antifuse layer and the conductive layer, after the forming of the top electrode, forming a second opening through the second dielectric layer, the second ESL and the first ESL to expose the second conductive feature, and forming a via and a conductive line in the second opening.

In some embodiments, the forming of the first opening includes depositing a hard mask layer over the second dielectric layer, patterning the hard mask layer to form a patterned hard mask layer, and etching the second dielectric layer, the second ESL and the first ESL using the patterned hard mask layer as an etch mask. In some instances, the conformally depositing of the antifuse layer includes depositing the antifuse layer on the patterned hard mask layer. In some implementations, the method further includes before the conformally depositing the antifuse layer, baking the workpiece.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:
1. An interconnect structure, comprising:
a first dielectric layer;
a first conductive feature and a second conductive feature in the first dielectric layer;
a first etch stop layer (ESL) disposed over the first dielectric layer and the second conductive feature;
a second ESL disposed directly on a top surface the first ESL;

a first dielectric feature extending through the first ESL and the second ESL to contact the first conductive feature;
a first conductive layer disposed on and in contact with the first dielectric feature;
a third ESL disposed over the first conductive layer;
a second dielectric layer disposed directly on top surfaces of the third ESL and the second ESL;
a first via extending through the second dielectric layer and the third ESL to contact with the first conductive layer; and
a second via extending through the second dielectric layer, the second ESL and the first ESL to contact with the second conductive feature.

2. The interconnect structure of claim 1, further comprising:
a fourth ESL vertically and directly sandwiched between the third ESL and the first conductive layer.

3. The interconnect structure of claim 2,
wherein the third ESL and the second ESL comprise silicon oxide or hydrogen-containing silicon oxycarbide,
wherein the first ESL and the fourth ESL comprise aluminum oxide, aluminum nitride, or hydrogen-containing silicon carbonitride.

4. The interconnect structure of claim 1,
wherein the first conductive feature and the second conductive feature comprise copper,
wherein the first conductive layer comprises tantalum nitride.

5. The interconnect structure of claim 1, wherein the first dielectric feature comprises aluminum oxide.

6. The interconnect structure of claim 1, further comprising:
a second dielectric feature disposed over a portion of the first ESL between the first dielectric feature and the second via;
a second conductive layer disposed on the second dielectric feature; and
a fifth ESL disposed over the second conductive layer,
wherein a portion of the second dielectric layer spans over the fifth ESL.

7. The interconnect structure of claim 6, further comprising:
a third via extending through the second dielectric layer and the fifth ESL to contact with the second conductive layer; and
a fourth via extending through the second dielectric layer and the fifth ESL to contact with the second conductive layer.

8. The interconnect structure of claim 7,
wherein the second dielectric feature comprises aluminum oxide,
wherein the second conductive layer comprises tantalum nitride.

9. The interconnect structure of claim 1, wherein the second dielectric layer is in contact with sidewalls of the second ESL, the dielectric feature, and the conductive layer.

10. An interconnect structure, comprising:
a first dielectric layer;
a first conductive feature and a second conductive feature in the first dielectric layer;
a first etch stop layer (ESL) disposed directly on the first dielectric layer and the second conductive feature;
a second ESL disposed directly on the first ESL;
a second dielectric layer disposed over the second ESL;
an antifuse layer extending through the second dielectric layer, the second ESL and the first ESL to physically contact the first conductive feature, the antifuse layer comprising an inside surface facing away from the second dielectric layer, the second ESL and the first ESL;
a conductive layer extending conformally along the inside surface of the antifuse layer, the conductive layer defining a space spaced apart from the second dielectric layer by the conductive layer and the antifuse layer; and
a top electrode disposed within the space,
wherein top surfaces of the second dielectric layer, the antifuse layer, the conductive layer, and the top electrode are coplanar.

11. The interconnect structure of claim 10, further comprising:
a contact via extending through the first ESL, the second ESL, and a lower portion of the second dielectric layer to physically contact the second conductive feature; and
a conductive line disposed directly on the contact via and extending through an upper portion of the second dielectric layer.

12. The interconnect structure of claim 11, wherein a top surface of the conductive line is coplanar with top surfaces of the second dielectric layer, the antifuse layer, the conductive layer, and the top electrode.

13. The interconnect structure of claim 10, wherein the first conductive feature, the second conductive feature, and the top electrode comprise copper.

14. The interconnect structure of claim 10, wherein the antifuse layer comprises aluminum oxide.

15. The interconnect structure of claim 10, wherein the conductive layer comprises tantalum nitride.

16. The interconnect structure of claim 10,
wherein the first ESL comprises aluminum oxide, aluminum nitride, or hydrogen-containing silicon carbonitride,
wherein the second ESL comprises silicon oxide or hydrogen-containing silicon oxycarbide.

17. A interconnect structure, comprising:
a first dielectric layer;
a first conductive feature and a second conductive feature in the first dielectric layer;
a first etch stop layer (ESL) over the first dielectric layer, the first conductive feature and the second conductive feature;
a second ESL disposed directly on the first ESL;
an antifuse layer extending through the first ESL and the second ESL toward the first conductive feature;
a resistive layer disposed on the antifuse layer;
a second dielectric layer over the resistive layer and the second ESL;
a first via extending through the second dielectric layer toward the resistive layer; and
a second via extending through the second dielectric layer, the first ESL and the second ESL toward the second conductive feature,
wherein the second dielectric layer is in contact with sidewalls of the second ESL, the antifuse layer, and the resistive layer.

18. The interconnect structure of claim 17,
wherein the first ESL comprises aluminum oxide, aluminum nitride, or hydrogen-containing silicon carbonitride,
wherein the second ESL comprises a nitrogen-free dielectric material.

19. The interconnect structure of claim 17, wherein the antifuse layer comprises hafnium oxide (HfO), aluminum oxide (AlO), aluminum nitride (AlN), titanium oxide (TiO), hafnium zirconium oxide (HfZrO), tantalum oxide (TaO), hafnium aluminum oxide (HfAlO), hafnium silicon oxide (HfSiO), zirconium oxide (ZrO), zirconium silicon oxide (ZrSiO), lanthanum oxide (LaO), yttrium oxide (YO), strontium titanium oxide (SrTiO), barium titanium oxide (BaTiO), barium zirconium oxide (BaZrO), hafnium lanthanum oxide (HfLaO), lanthanum silicon oxide (LaSiO), aluminum silicon oxide (AlSiO), hafnium tantalum oxide (HfTaO), or hafnium titanium oxide (HfTiO).

20. The interconnect structure of claim 17, wherein the resistive layer comprises titanium nitride (TiN), tantalum nitride (TaN), tungsten nitride (WN), or a combination thereof.

\* \* \* \* \*